US012593436B2

(12) United States Patent
Hwang

(10) Patent No.: US 12,593,436 B2
(45) Date of Patent: Mar. 31, 2026

(54) VERTICALLY STACKED MEMORY DEVICE AND MANUFACTURING METHOD THEREOF

(71) Applicant: Seoul National University R&DB foundation, Seoul (KR)

(72) Inventor: Cheol Seong Hwang, Seoul (KR)

(73) Assignee: Seoul National University R&DB foundation, Seoul (KR)

( * ) Notice: Subject to any disclaimer, the term of this patent is extended or adjusted under 35 U.S.C. 154(b) by 379 days.

(21) Appl. No.: 18/569,588

(22) PCT Filed: Oct. 17, 2023

(86) PCT No.: PCT/KR2023/016041
§ 371 (c)(1),
(2) Date: Dec. 12, 2023

(87) PCT Pub. No.: WO2024/136059
PCT Pub. Date: Jun. 27, 2024

(65) Prior Publication Data
US 2025/0089231 A1      Mar. 13, 2025

(30) Foreign Application Priority Data

Dec. 21, 2022    (KR) ........................ 10-2022-0180945

(51) Int. Cl.
*H10B 12/00*          (2023.01)

(52) U.S. Cl.
CPC ............. *H10B 12/05* (2023.02); *H10B 12/03* (2023.02); *H10B 12/30* (2023.02)

(58) Field of Classification Search
CPC ........ H10B 12/05; H10B 12/03; H10B 12/30; H10B 12/00; H10B 12/488; H10B 12/033; H10D 48/30; H10D 30/025
(Continued)

(56) References Cited

U.S. PATENT DOCUMENTS 11,355,496 B2    6/2022  Manfrini et al.
2020/0083225 A1   3/2020  Ma et al.
(Continued)

FOREIGN PATENT DOCUMENTS

KR    10-2019-0038223    4/1999
KR    10-2021-0007737    1/2021
(Continued)

OTHER PUBLICATIONS

International Search Report mailed Jan. 17, 2024 for PCT/KR2023/016041.

*Primary Examiner* — Duy T Nguyen

(57) ABSTRACT

The present disclosure discloses a vertical stack-type memory device may including a word line extending in a horizontal direction and having a vertical through-hole region, a vertical bit line arranged vertically to pass through the through-hole region, a channel layer pattern arranged to surround the vertical bit line inside the through-hole region, a body insulating layer disposed between the vertical bit line and a remaining portion except for the one end of the channel layer pattern, an electrode member arranged to surround an outer peripheral surface of the channel layer pattern at a height higher than the word line, a dielectric layer pattern disposed between the word line and the channel layer pattern and having a structure surrounding the electrode member, and a plate electrode in contact with the dielectric layer pattern above the word line.

20 Claims, 44 Drawing Sheets

(58) Field of Classification Search
USPC ........................................................... 257/296
See application file for complete search history.

(56)                          References Cited

U.S. PATENT DOCUMENTS

| | | | | |
|---|---|---|---|---|
| 2020/0176465 | A1* | 6/2020 | Tang .................... | H10B 12/036 |
| 2020/0212041 | A1* | 7/2020 | Machkaoutsan ....... | H10B 12/03 |
| 2021/0249315 | A1 | 8/2021 | Kang et al. | |
| 2021/0249415 | A1* | 8/2021 | Kang ..................... | H10B 12/30 |
| 2021/0384258 | A1* | 12/2021 | Hwang .................. | H10D 99/00 |
| 2022/0005810 | A1* | 1/2022 | Kang ..................... | H10B 12/30 |
| 2022/0115378 | A1* | 4/2022 | Lee ......................... | H10B 12/09 |
| 2022/0384444 | A1 | 12/2022 | Chiang et al. | |

FOREIGN PATENT DOCUMENTS

| | | | | |
|---|---|---|---|---|
| KR | 10-2022-0047047 | | 4/2022 | |
| KR | 20220047047 | A  * | 4/2022 | ............. H10B 12/48 |
| KR | 10-2022-0166604 | | 12/2022 | |

* cited by examiner

VERTICALLY STACKED MEMORY DEVICE AND MANUFACTURING METHOD THEREOF

This application claims the priority of Korean Patent Application No. 10-2022-0180945, filed on Dec. 21, 2022 in the KIPO (Korean Intellectual Property Office), the disclosure of which is incorporated herein entirely by reference. Further, this application is the National Stage application of International Application No. PCT/KR2023/016041, filed on Oct. 17, 2023, which designates the United States and was published in Korean. Each of these applications is hereby incorporated by reference in their entirety into the present application.

TECHNICAL FIELD

The present invention relates to semiconductor/electronic devices and a manufacturing method thereof, and more particularly, to vertical stack-type memory devices and manufacturing methods thereof.

BACKGROUND ART

There is a continuous need to increase the performance of semiconductor devices and the degree of integration of semiconductor devices. Arranging unit cells of semiconductor devices two-dimensionally, that is, in a planar manner, is reaching its limit in increasing the degree of integration of semiconductor devices. Accordingly, the attempts are being made to develop technologies which greatly increase the degree of integration of semiconductor devices by three-dimensionally integrating the unit cells of the semiconductor devices. In this regard, the attempts to increase the integration of memory devices such as NAND devices or DRAM devices are being attempted in various forms. In addition, research and development are continuously being conducted to improve the performance and operating characteristics of memory devices.

DISCLOSURE OF THE INVENTION

Technical Problem

The technological object to be achieved by the present invention is to provide a vertical stack-type memory device and a manufacturing method thereof which may increase integration degree and achieve excellent performance.

Technical Solution

The technological object to be solved by the present invention is not limited to the objects mentioned above, and other objects not mentioned will be understood by those skilled in the art from the description below.

According to an embodiment of the present invention, there is provided a manufacturing method of a vertical stack-type memory device comprising: forming an upper stack including a first upper insulating layer, a first upper sacrificial layer, a second upper insulating layer, a second upper sacrificial layer, and an upper buffer layer which are sequentially stacked on an insulating material layer; forming a first vertical hole penetrating through the upper stack; forming a first recess by removing portions of the first and second upper sacrificial layers and the first and second upper insulating layers exposed by the first vertical hole; forming a second recess by further removing a portion of the second upper sacrificial layer exposed by the first recess; forming a dielectric material layer on an inner surface of the first vertical hole including surfaces of the first and second recesses; forming an electrode member filling the second recess on a region of the dielectric material layer formed in the second recess; forming a channel material layer on the dielectric material layer and the electrode member exposed on the inner surface of the first vertical hole; forming a dielectric layer pattern from the dielectric material layer, and forming a channel layer pattern from the channel material layer by removing portions of the dielectric material layer and the channel material layer which are disposed outside the first and second recesses; forming a body insulating layer covering the channel layer pattern and the dielectric layer pattern and filling the first vertical hole; forming a second vertical hole penetrating through the body insulating layer and exposing one end of the channel layer pattern; forming a vertical bit line filling the second vertical hole; forming a first trench disposed spaced apart from the vertical bit line and penetrating through the upper stack; forming a third recess by removing the first upper sacrificial layer exposed by the first trench; forming a word line filling the third recess; exposing a portion of the dielectric layer pattern by removing the second upper sacrificial layer and the upper buffer layer; and forming a plate electrode in contact with the exposed portion of the dielectric layer pattern.

The forming the electrode member may include forming an electrode material layer filling the second recess on the dielectric material layer; and removing a remaining portion except for the portion disposed in the second recess in the electrode material layer by using a wet etching method.

A first region of the channel layer pattern may be connected to the vertical bit line, and a second region of the channel layer pattern may be connected to the electrode member.

The word line, the channel layer pattern, a first portion of the dielectric layer pattern disposed between the word line and the channel layer pattern, and at least a portion of the vertical bit line may constitute an upper cell transistor, the electrode member, the plate electrode and the second portion of the dielectric layer pattern disposed between the electrode member and the plate electrode may constitute an upper cell capacitor, and the upper cell transistor and the upper cell capacitor may constitute an upper memory cell.

A lower memory cell having a structure in which the upper memory cell is upside down may be formed under the insulating material layer, and the lower memory cell may include a lower cell transistor having a structure in which the upper cell transistor is upside down and a lower cell capacitor having a structure in which the upper cell capacitor is upside down.

The manufacturing method of the vertical stack-type memory device may further include forming a stepped groove exposing a portion of the word line by removing a portion of the plate electrode and a portion of the second upper insulating layer; forming an insulating filler that fills the stepped groove; forming a second trench penetrating through the insulating material layer from the plate electrode on an opposite side of the stepped groove with the vertical bit line interposed therebetween; forming a fourth recess by removing a portion of the word line exposed by the second trench; forming an isolation insulating layer filling the fourth recess and separating the word line from the second trench; and forming a common electrode portion filling the second trench and being connected to the plate electrode.

The vertical stack-type memory device may include a plurality of plate electrodes spaced apart in a vertical direction, and the common electrode portion may be formed to interconnect the plurality of plate electrodes, and the common electrode portion may be formed to interconnect the plurality of plate electrodes.

The manufacturing method of the vertical stack-type memory device may further include forming a first contact plug connected to the word line exposed by the stepped groove and a second contact plug connected to the common electrode portion.

The first upper sacrificial layer may include a silicon nitride having a first composition, and the second upper sacrificial layer may include a silicon nitride having a second composition different from the first composition.

The insulating material layer may include a silicon oxide having a first density, and the first and second upper insulating layers may include a silicon oxide having a second density less than the first density.

The upper buffer layer may include silicon.

According to another embodiment of the present invention, there is provided a manufacturing method of a vertical stack-type memory device comprising: forming a lower stack including a lower buffer layer, a first lower sacrificial layer, a first lower insulating layer, a second lower sacrificial layer, and a second lower insulating layer which are sequentially stacked; forming an insulating material layer on the lower stack; forming an upper stack including a first upper insulating layer, a first upper sacrificial layer, a second upper insulating layer, a second upper sacrificial layer, and an upper buffer layer which are sequentially stacked on the insulating material layer; forming a first vertical hole penetrating through the upper stack, the insulating material layer, and the lower stack; forming a plurality of first recesses by removing portions of the first and second upper sacrificial layers, the first and second upper insulating layers, the first and second lower sacrificial layers, and the first and second lower insulating layers exposed by the first vertical hole; forming a plurality of second recesses by further removing portions of the first lower sacrificial layer and the second upper sacrificial layer exposed by the plurality of first recesses; forming a dielectric material layer on an inner surface of the first vertical hole including surfaces of the plurality of first and second recesses; forming a plurality of electrode members filling the plurality of second recesses on regions of the dielectric material layer formed in the plurality of second recesses; forming a channel material layer on the dielectric material layer and the electrode member exposed on the inner surface of the first vertical hole; forming a plurality of dielectric layer patterns from the dielectric material layer and forming a plurality of channel layer patterns from the channel material layer by removing portions of the dielectric material layer and the channel material layer which are disposed outside the first and second recesses; forming a body insulating layer which covers the plurality of channel layer patterns and the plurality of dielectric layer patterns and fills the first vertical hole; forming a second vertical hole penetrating through the body insulating layer and exposing one end of each of the plurality of channel layer patterns; forming a vertical bit line filling the second vertical hole; forming a first trench spaced apart from the vertical bit line and penetrating through the upper and lower stack; forming a plurality of third recesses by removing the first upper sacrificial layer and the second lower sacrificial layer exposed by the first trench; forming a plurality of word lines filling the plurality of third recesses; exposing a portion of the plurality of dielectric layer patterns by removing the second upper sacrificial layer, the first lower sacrificial layer, the upper buffer layer, and the lower buffer layer; and forming a plurality of plate electrodes in contact with exposed portions of the plurality of dielectric layer patterns.

The forming the plurality of electrode members may include forming an electrode material layer filling the plurality of second recesses on the dielectric material layer; and removing a remaining portion of the electrode material layer except for the portion disposed in the plurality of second recesses by using a wet etching method.

A first region of each of the plurality of channel layer patterns may be connected to the vertical bit line, and a second region of each of the plurality of channel layer patterns may be connected to the electrode member.

The manufacturing method of a vertical stack-type memory device may further include forming a stepped groove exposing a portion of each of the plurality of word lines by removing a portion of a stacked structure composed of the plurality of plate electrodes, the plurality of word lines, the insulating material layer, the first and second lower insulating layers, and the first and second upper insulating layers; forming an insulating filler which fills the stepped groove; forming a second trench penetrating through the stacked structure on an opposite side of the stepped groove with the vertical bit line interposed therebetween; forming a plurality of fourth recesses by removing a portion of the plurality of word lines exposed by the second trench; forming a plurality of isolation insulating layers filling the plurality of fourth recesses and separating the plurality of word lines from the second trench; and forming a common electrode portion filling the second trench and interconnecting the plurality of plate electrodes.

The manufacturing method of the vertical stack-type memory device may further include forming a plurality of first contact plugs connected to the plurality of word lines exposed by the stepped groove, and a second contact plug connected to the common electrode portion.

According to another embodiment of the present invention, there is provided a vertical stack-type memory device comprising an upper memory cell, the upper memory cell comprising: a word line extending in a horizontal direction and having a vertical through-hole region; a vertical bit line arranged vertically to pass through the through-hole region; a channel layer pattern arranged to surround the vertical bit line inside the through-hole region, one end of which is connected to the vertical bit line and extending upward beyond an upper surface of the word line; a body insulating layer disposed between the vertical bit line and a remaining portion except for the one end of the channel layer pattern; an electrode member arranged to surround an outer peripheral surface of the channel layer pattern at a height higher than the word line; a dielectric layer pattern disposed between the word line and the channel layer pattern and having a structure surrounding the electrode member, one end of which is in contact with the vertical bit line and the other end of which is in contact with the other end of the channel layer pattern; and a plate electrode in contact with the dielectric layer pattern above the word line.

The electrode member may have a ring-shaped structure.

The dielectric layer pattern may have a structure surrounding the vertical bit line and may have structure defining a first recess region therein and a second recess region disposed above the first recess region, and the second recess region may have a structure extending more outwardly than the first recess region with respect to the vertical bit line, and the electrode member may be disposed in the second recess region.

The vertical stack-type memory device may further include a lower memory cell disposed below the upper memory cell, and the lower memory cell may have a structure in which the upper memory cell is upside down.

Advantageous Effects

According to embodiments of the present invention, it is possible to implement a vertical stack-type memory device which may significantly improve integration degree and have excellent performance and operation characteristics. In particular, in the vertical stack-type memory device according to embodiments of the present invention, the operating characteristics and performance of the capacitor including the electrode member and the transistor including the channel layer pattern may be improved by forming the electrode member and the channel layer pattern independently in a predetermined shape according to a given method in a three-dimensional stacked structure. According to one example, the vertical stack-type memory device may be configured to include a vertical-type dynamic random access memory (DRAM) device.

However, the effects of the present invention are not limited to the above effects and may be expanded in various ways without departing from the technological spirit and scope of the present invention.

BRIEF DESCRIPTION OF THE DRAWINGS

FIG. 16 to FIG. 26 are diagrams schematically showing a manufacturing method of a vertical stack-type memory device according to an embodiment of the present invention.

BEST MODE FOR CARRYING OUT THE INVENTION

Figure 1A:
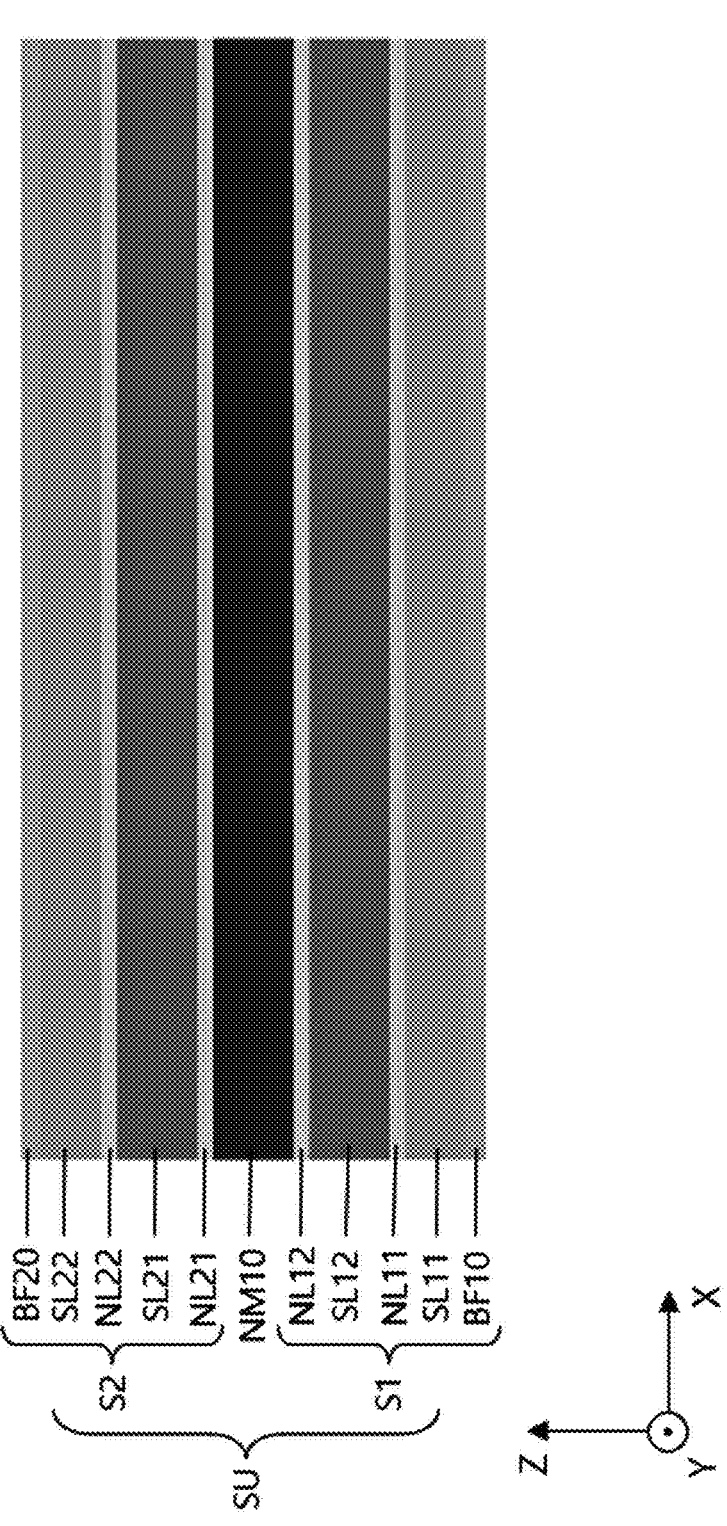
FIG. 1A to FIG. 15B are diagrams schematically showing a manufacturing method of a vertical stack-type memory device according to an embodiment of the present invention.

Hereinafter, the embodiments of the present invention will be described in detail with reference to the accompanying drawings.

The embodiments of the present invention to be described below are provided to more clearly explain the present invention to those skilled in the art, and the scope of the present invention is not limited by the following embodiments, and the embodiments may be modified in many different forms.

The terms used in this specification are used to describe specific embodiments and are not intended to limit the present invention. The terms indicating a singular form used herein may include plural forms unless the context clearly indicates otherwise. Also, as used herein, the terms, "comprise" and/or "comprising" specify the presence of the stated shape, step, number, operation, member, element, and/or group thereof and does not exclude the presence or addition of one or more other shapes, steps, numbers, operations, elements, elements and/or groups thereof. In addition, the term, "connection" used in this specification means not only a direct connection of certain members, but also a concept including an indirect connection in which other members are interposed between the members.

In addition, in the description of this specification, descriptions such as "first" and "second", "upper or top", and "lower or bottom" are intended to distinguish members, and they are not used to limit the members themselves, or to mean a specific order, but rather they are used to convey a relative positional relationship and does not limit the specific cases where other configuration members are in direct contact with the described members or another member is introduced into the interface between them. The same interpretation may be applied to other expressions which describe relationships between components.

In addition, in the present specification, when a member is said to be located "on" another member, this arrangement includes not only a case in which a member is in contact with another member, but also a case where another member exists between the two members. As used herein, the term, "and/or" includes any one and all combinations of one or more of the listed items. In addition, the terms of degree such as "about" and "substantially" used in the present specification are used as a range of values or degrees, or as a meaning close thereto, taking into account inherent manufacturing and substance tolerances, and exact or absolute figures provided to aid in the understanding of this application are used to prevent the infringers from unfairly exploiting the stated disclosure.

Hereinafter, embodiments of the present invention will be described in detail with reference to the accompanying drawings. A size or a thickness of areas or parts shown in the accompanying drawings may be slightly exaggerated for clarity of the specification and convenience of description. The same reference numbers indicate the same configuring elements throughout the detailed description.

FIG. 1A to FIG. 15B are diagrams schematically showing a manufacturing method of a vertical stack-type memory device according to an embodiment of the present invention. FIGS. 1A, 2A, 3A, 4A, 5A, 6A, 7A, 8A, 9A, 10A, 11A, 12A, 13A, 14A, 15A are cross-sectional views, and FIGS. 1B, 2B, 3B, 4B, 5B, 6B, 7B, 8B, 9B, 10B, 11B, 12B, 13B, 14B, and 15B are plan views.

Figure 1B:
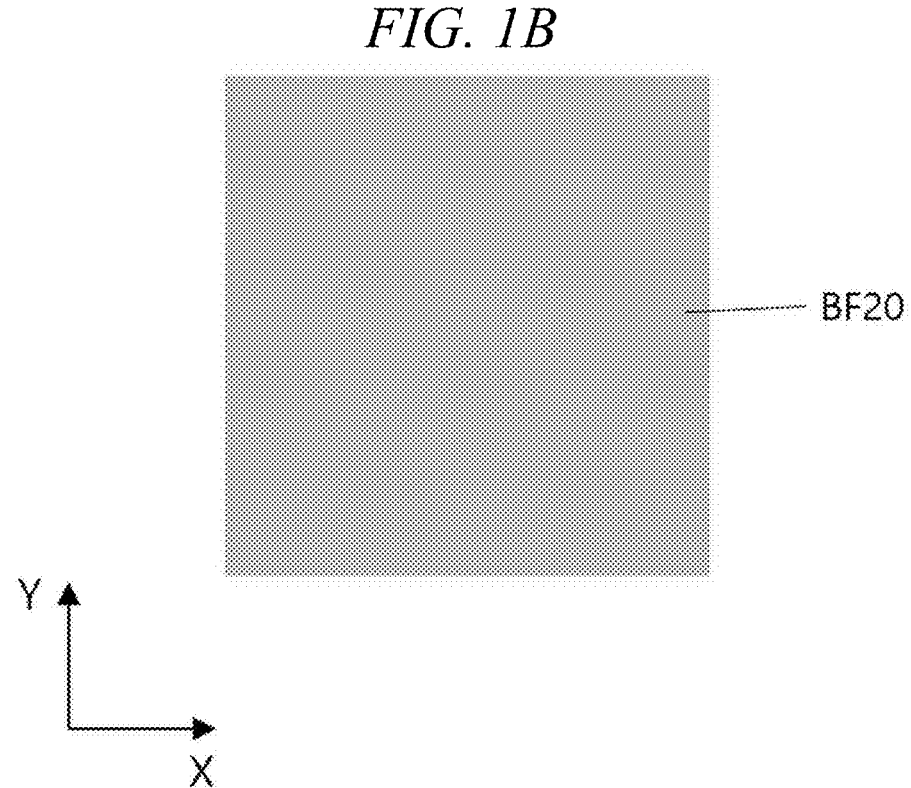

Referring to FIGS. 1A and 1B, an insulating material layer NM10 may be formed on a predetermined substrate (not shown). A material of the substrate may be selected from a variety of materials. The substrate may be formed to include a semiconductor material or an insulating material. The substrate may include a semiconductor wafer. The substrate may include a bulk silicon substrate, a silicon-on-insulator (SOI) substrate, a germanium substrate, or a germanium-on-insulator (GOI) substrate, a silicon-germanium substrate, or a substrate formed by an epitaxial growth process.

The insulating material layer NM10 may be formed on the substrate through a deposition process. The insulating material layer NM10 may include an insulating material such as silicon oxide. A plurality of layers may be sequentially stacked on the insulating material layer NM10. The plurality of layers may constitute an upper stack S2. A first upper insulating layer NL21, a first upper sacrificial layer SL21, a second upper insulating layer NL22, a second upper sacrificial layer SL22, and a upper buffer layer BF20 may be deposited on the insulating material layer NM10. The upper stack S2 may be composed of a stacked structure including the first upper insulating layer NL21, the first upper sacrificial layer SL21, the second upper insulating layer NL22, the second upper sacrificial layer SL22, and the upper buffer layer BF20.

The first upper insulating layer NL21 may be deposited as a layer different from the insulating material layer NM10. The first upper insulating layer NL21 may be formed as a layer having an etch rate different from that of the insulating material layer NM10 in a later etching process step. For example, the first upper insulating layer NL21 may be formed to include porous silicon oxide. The insulating material layer NM10 may be formed to include a silicon oxide layer more densely than the first upper insulating layer NL21. The insulating material layer NM10 may include silicon oxide having a first density, and the first upper insulating layer NL21 may include silicon oxide having a second density smaller than the first density. The first upper insulating layer NL21 may be formed to have a thinner thickness than that of the insulating material layer NM10.

The first upper sacrificial layer SL21 may be deposited on the first upper insulating layer NL21. The first upper sacrificial layer SL21 may be formed of a material different from that of the first upper insulating layer NL21 and that of the insulating material layer NM10. The first upper sacrificial layer SL21 may be formed as a layer having an etch rate different from that of the first upper insulating layer NL21 and that of the insulating material layer NM10 in a later etching process step. The first upper sacrificial layer SL21, the first upper insulating layer NL21, and the insulating material layer NM10 may have an etch selectivity to each other. The first upper sacrificial layer SL21 may include silicon nitride. The first upper sacrificial layer SL21 may be formed to be thicker than the first upper insulating layer NL21.

The second upper insulating layer NL22 may be deposited on the first upper sacrificial layer SL21. The second upper insulating layer NL22 may be deposited from a material different from that of the first upper sacrificial layer SL21. The second upper insulating layer NL22 may be formed as a layer having an etch rate different from that of the first upper sacrificial layer SL21 and that of the insulating material layer NM10 in a later etching process step. For example, the second upper insulating layer NL22 may include porous silicon oxide. The second upper insulating layer NL22 may be formed of substantially the same material as that of the first upper insulating layer NL21. The insulating material layer NM10 may include silicon oxide having a first density, and the second upper insulating layer NL22 may include silicon oxide having a second density smaller than the first density.

The second upper sacrificial layer SL22 may be deposited on the second upper insulating layer NL22. The second upper sacrificial layer SL22 may be formed of a material different from that of the second upper insulating layer NL22 and that of the insulating material layer NM10. The second upper sacrificial layer SL22 may be formed as a layer having an etch rate different from that of the second upper insulating layer NL22 and that of the insulating material layer NM10 in a later etching process step. The second upper sacrificial layer SL22, the second upper insulating layer NL22, and the insulating material layer NM10 may have an etch selectivity to each other. The second upper sacrificial layer SL22 may be formed as a layer having an etch rate different from that of the first upper sacrificial layer SL21.

The second upper sacrificial layer SL22 may include silicon nitride. The second upper sacrificial layer SL22 may be formed by a silicon nitride having a different composition ratio than that of the first upper sacrificial layer SL21. For example, the first upper sacrificial layer SL21 may include a layer of silicon nitride with a composition of $SiN_{X1}$, and the second upper sacrificial layer SL22 may include a layer of silicon nitride with a composition of $SiN_{X2}$. Here, X1 and X2 may be a different number. In other words, the first upper sacrificial layer SL21 may include silicon nitride having a first composition, and the second upper sacrificial layer SL22 may include silicon nitride having a second composition different from the first composition. Since the first upper sacrificial layer SL21 and the second upper sacrificial layer SL22 are composed of layers of silicon nitride with different compositions, the first upper sacrificial layer SL21 and the second upper sacrificial layer SL22 may have an etch selectivity to each other in a later etching process step.

The upper buffer layer BF20 may be deposited on the second upper sacrificial layer SL22. The upper buffer layer BF20 may be formed as a layer of a material with an etch rate different from those of the second upper sacrificial layer SL22, the first upper sacrificial layer SL21, the second upper insulating layer NL22, and the first upper insulating layer NL21 in a later etching process step. The upper buffer layer BF20 may include a layer of a different material from the second upper sacrificial layer SL22 or the second upper insulating layer NL22. For example, the upper buffer layer BF20 may include silicon. As a specific example, the upper buffer layer BF20 may be formed by including a polysilicon layer.

A lower stack S1 may be further formed on the substrate before forming the insulating material layer NM10 and the upper stack S2 on the substrate. After forming the lower stack S1, the insulating material layer NM10 and the upper stack S2 may be sequentially formed thereon. The lower stack S1 may have substantially the same structure as that in which the upper stack S2 is reversed vertically. The lower stack S1 may have a symmetrical (top-bottom symmetrical) structure for the upper stack S2 with the insulating material layer NM10 interposed therebetween.

The lower stack S1 may include a lower buffer layer BF10, a first lower sacrificial layer SL11, a first lower insulating layer NL11, a second lower sacrificial layer SL12, and a second lower insulating layer NL12 sequentially stacked from the bottom. The lower buffer layer BF10, the first lower sacrificial layer SL11, the first lower insulating layer NL11, the second lower sacrificial layer SL12, and the second lower insulating layer NL12 may be formed sequentially, and the insulating material layer NM10 may be formed on the lower insulating layer NL12. The second lower insulating layer NL12, the second lower sacrificial layer SL12, the first lower insulating layer NL11, the first lower sacrificial layer SL11, and the lower buffer layer BF10 may include a same material composition as the first upper insulating layer NL21, the first upper sacrificial layer SL21, the second upper insulating layer NL22, the second upper sacrificial layer SL22, and the upper buffer layer BF20, respectively.

The lower stack S1, the insulating material layer NM10, and the upper stack S2 may form one stack unit SU in which a plurality of layers are stacked. A plurality of stack units SU may be stacked on the substrate. The processes for depositing the individual layers constituting the stack unit SU may be performed by using various deposition techniques. For example, the above-mentioned layers may be deposited by using the techniques such as a thermal chemical vapor deposition (thermal CVD), a plasma enhanced CVD, a physical vapor deposition PVD, or an atomic layer deposition ALD techniques and the like.

Figure 2A:
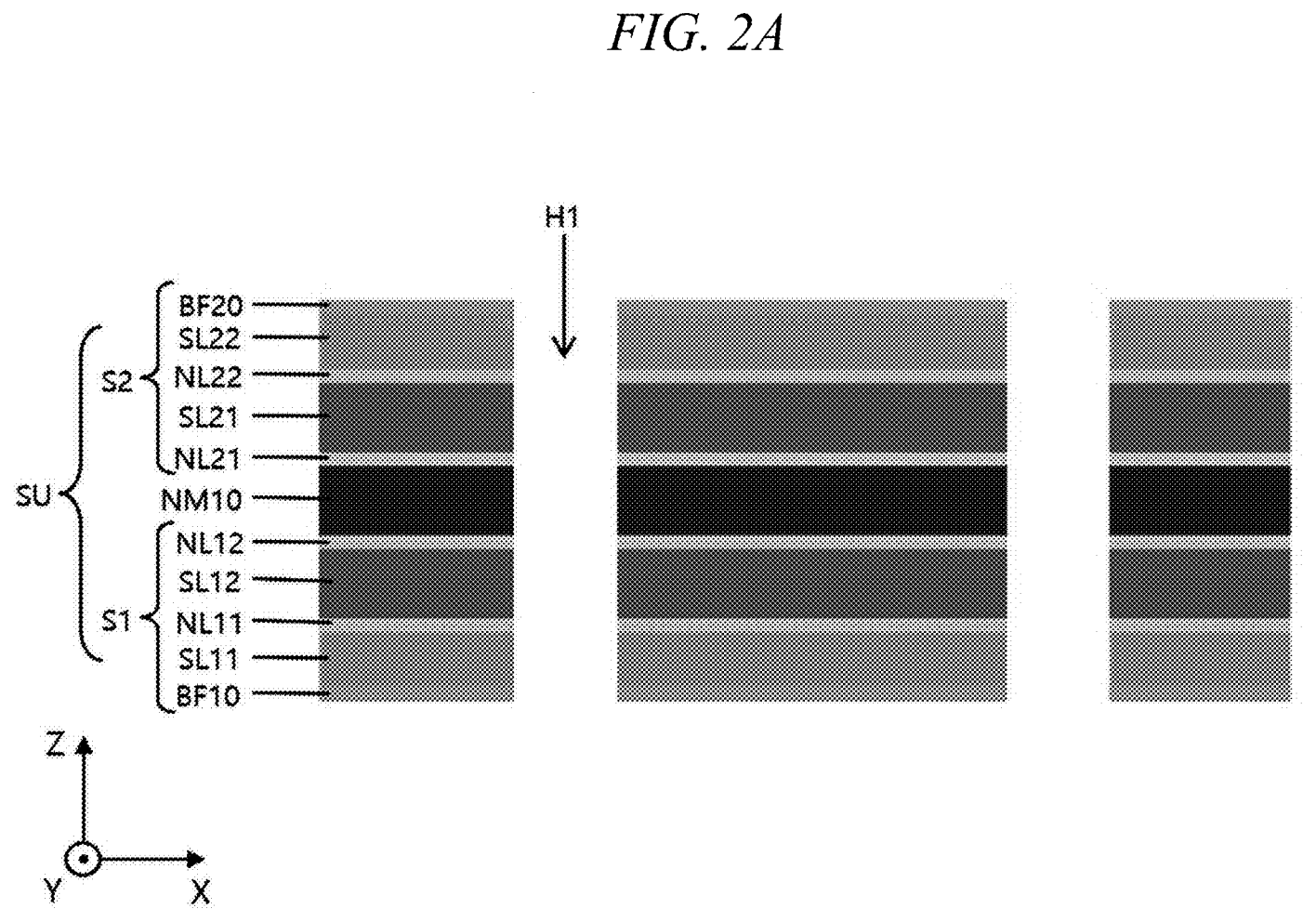
Figure 2B:
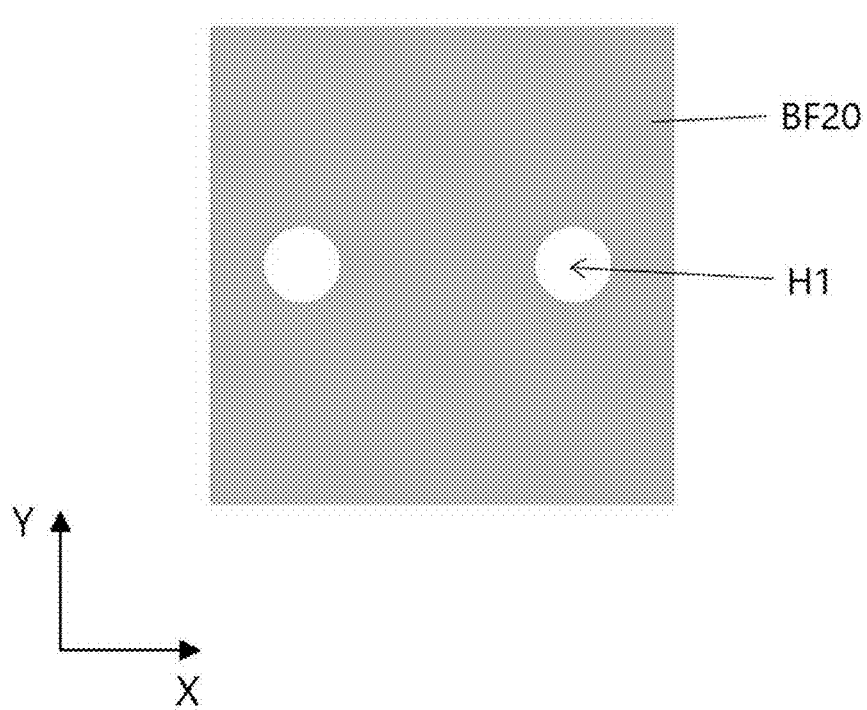

Referring to FIGS. 2A and 2B, a first vertical hole H1 may be formed in the stack unit SU. A first vertical hole H1 may be formed to substantially penetrate through the upper stack S2 and penetrate through the insulating material layer NM10 located below the upper stack S2. The first vertical hole H1 may extend vertically to further penetrate through the lower stack S1 below the insulating material layer NM10. The first vertical hole H1 may be formed through an etching process which removes a portion of the stack unit SU. For example, the first vertical hole H1 may be formed by forming an etch mask (not shown) such as a photoresist pattern on the upper buffer layer BF10 of the upper stack S2, and dry etching the portion exposed by the etch mask. The first vertical hole H1 may be formed in plural numbers.

Figure 3A:
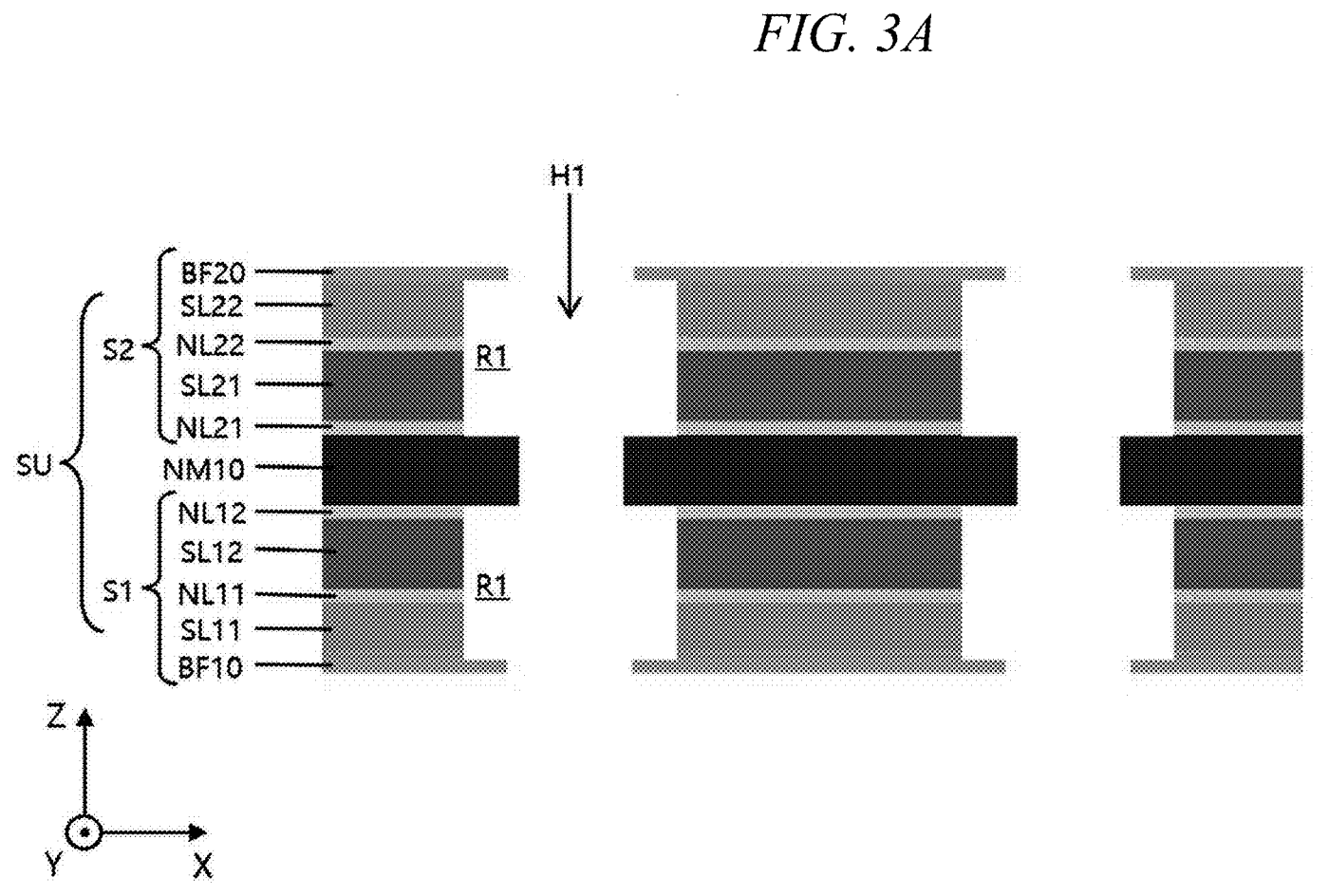
Figure 3B:
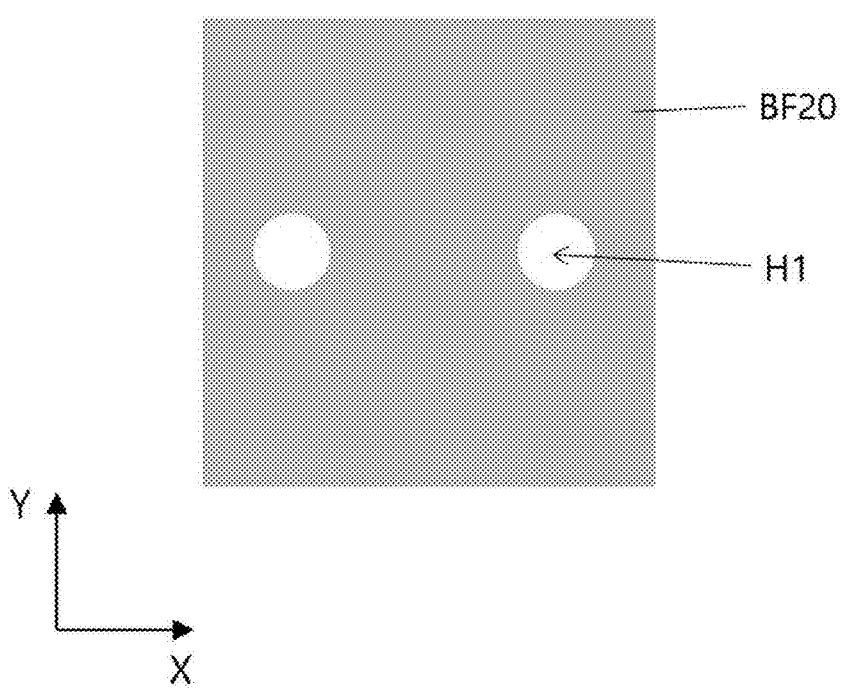

Referring to FIG. 3A and FIG. 3B, a first recess (first recess portion) R1 may be formed by removing portions of the first and second upper sacrificial layers SL21, SL22 and the first and second upper insulating layers NL21, NL22 exposed by the first vertical hole H1. The first recess R1 which is laterally concave may be formed by recessing the side surfaces of the first and second upper sacrificial layers SL21, SL22 and the first and second upper insulating layers NL21, NL22 exposed by the first vertical hole H1. The first recess R1 may have an annular shape surrounding the first vertical hole H1 with the first vertical hole H1 at its center.

The forming the first recess R122 may include a process for introducing a wet etchant, that is, a wet etching solution, into the first vertical hole H1 to induce each layer to be recessed. At this time, the degree of recess of each layer may be adjusted through wet etching condition having selectivity. The insulating material layer NM10, the upper buffer layer BF20, and the lower buffer layer BF10 may not be recessed or may be recessed to a small extent, and the remaining layers may be recessed more easily. The first and second upper sacrificial layers SL21, SL22 and the first and second upper insulating layers NL21, NL22 may be recessed laterally to a larger extent as compared with the insulating material layer NM10 and the upper buffer layer BF20.

Side surfaces of the first and second lower sacrificial layers SL11, SL12 and the first and second lower insulating layers NL11, NL12 exposed by the first vertical hole H1 may also be recessed and the first recess R1 may also be formed in the lower stack S1. That is, portions of the first and second lower sacrificial layers SL11, SL12 and the first and second lower insulating layers NL11, NL12 exposed by the first vertical hole H1 are removed, and thus, the first recess R1 may be formed. The first and second lower sacrificial layers SL11, SL12 and the first and second lower insulating layers NL11, NL12 may be recessed laterally to a larger extent as compared with the insulating material layer NM10 and the lower buffer layer BF10. The degree of recess may increase in the order such as the insulating material layer NM10, the lower/the upper buffer layers BF10, BF20, and the remaining layers.

Figure 4A:
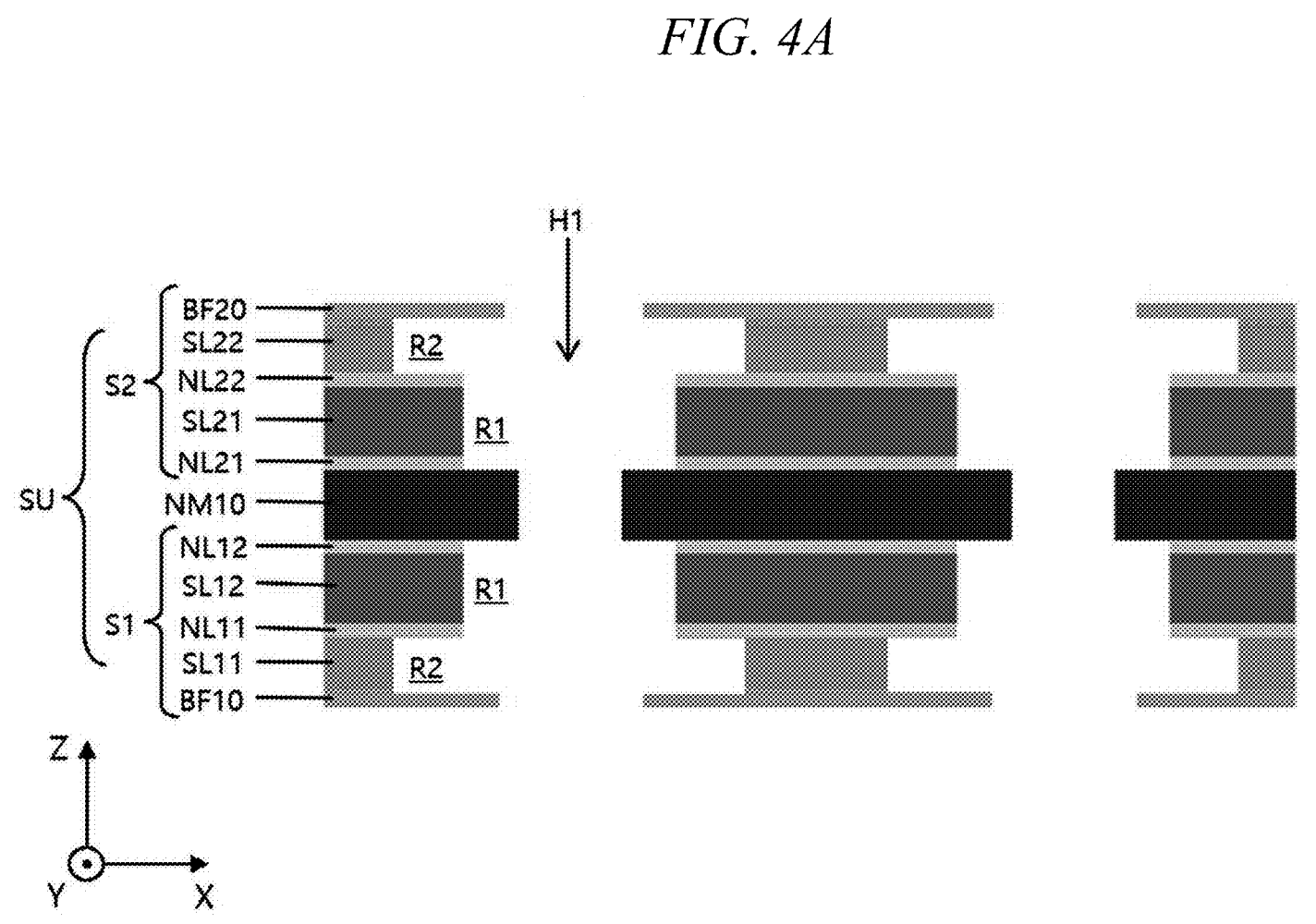
Figure 4B:
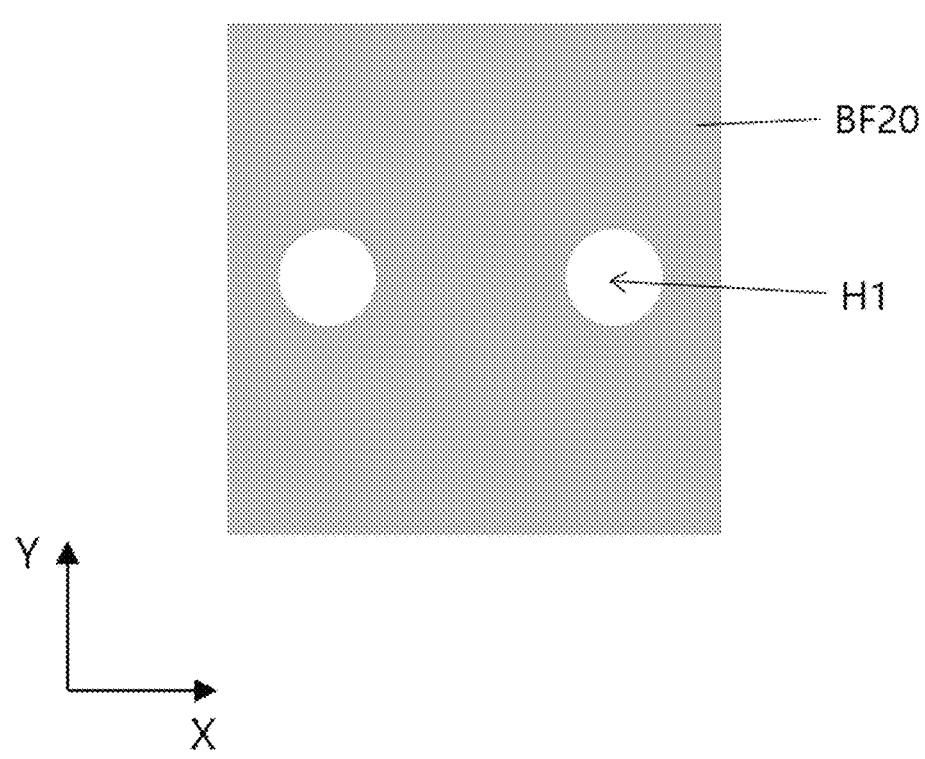

Referring to FIGS. 4A and 4B, a second recess (second recess portion) R2 which is further recessed laterally may be formed within the first recess R1. The second recess R2 may be a region where a capacitor portion will be located in a subsequent process. By forming the second recess R2, the surface area of the capacitor portion may be increased, and the capacitor portion and the gate portion (i.e., a word line) may be easily separated. The second recess R2 may be formed by further selectively etching/removing the side portion of the second upper sacrificial layer SL22 exposed by the first recess R1. The second recess R2 may be formed through a wet etching process using a wet etchant. Since the second upper sacrificial layer SL22 and the first upper sacrificial layer SL21 have an etch selectivity to each other, the second upper sacrificial layer SL22 may be selectively etched among the first and second upper sacrificial layers SL21, SL22.

The second recess R2 may have an annular shape surrounding the first vertical hole H1. One recess structure including the first and second recesses R1 and R2 may have a stepped structure in the lateral X-axis direction.

The first lower sacrificial layer SL11 corresponding to the second upper sacrificial layer SL22 may also be further recessed in the first recess R1, and as a result, the second recess R2 may be formed in the lower stack S1 to which the first vertical hole H1 extends.

Figure 5A:
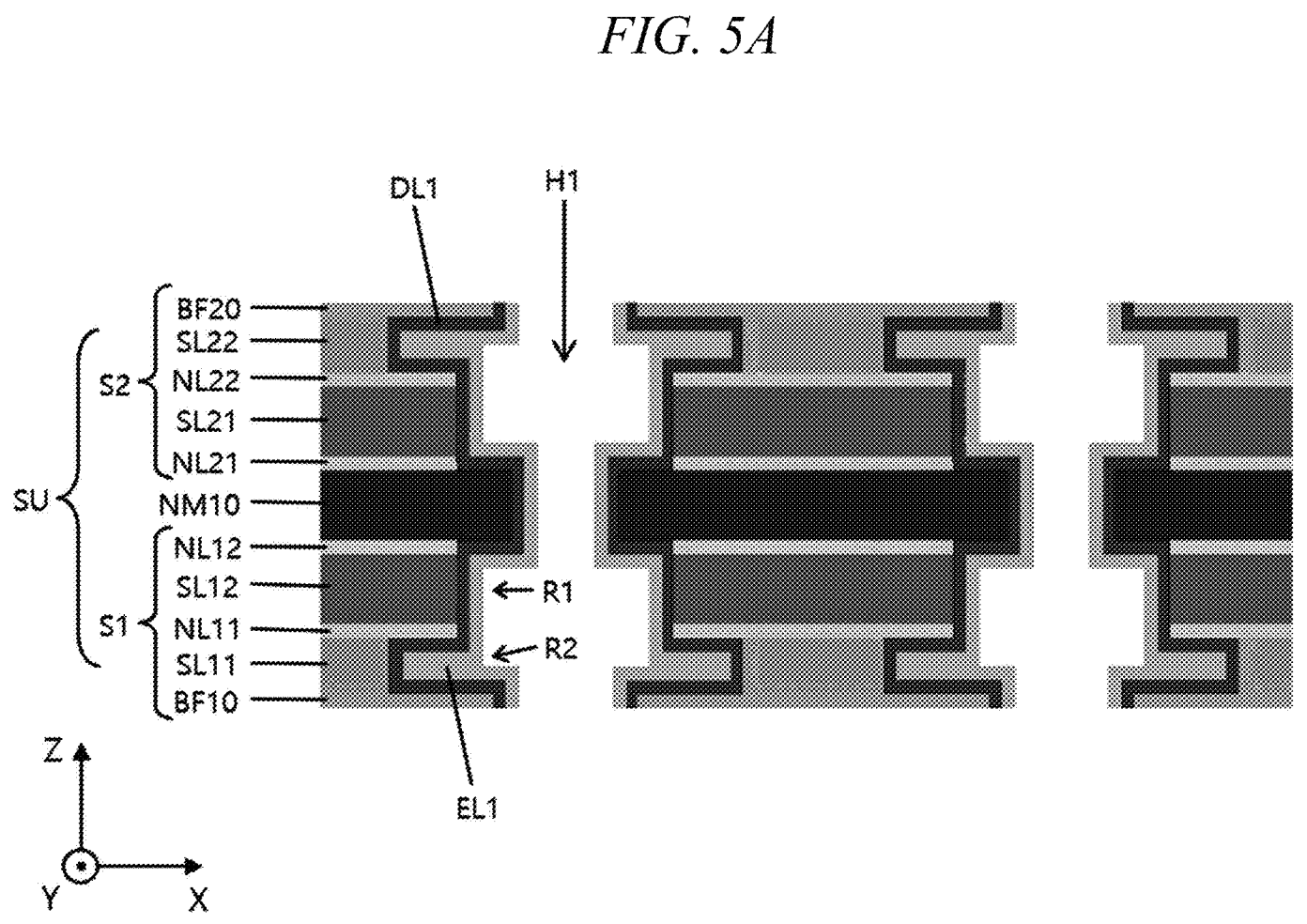
Figure 5B:
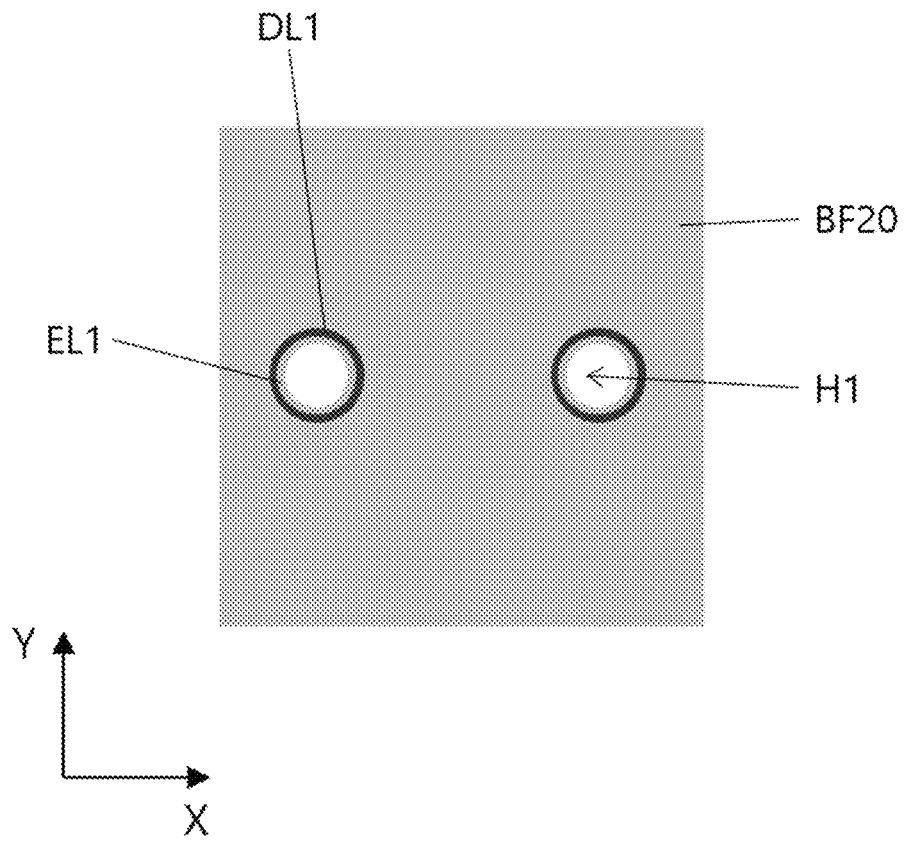

Referring to FIGS. 5A and 5B, a dielectric material layer DL1 may be formed on an inner surface of the first vertical hole H1 including surfaces of the first and second recesses R1 and R2. The dielectric material layer DL1 may be formed to conformally cover the inner surface of the first vertical hole H1 including the surfaces of the first and second recesses R1 and R2.

The dielectric material layer DL1 may be formed to include at least one of various dielectric materials. For example, the dielectric material layer DL1 may include a high-k material with a higher dielectric constant than that of a silicon nitride. Since a portion of the dielectric material layer DL1 may be used as a gate insulating layer of a transistor, and another portion may be used as a dielectric layer of a capacitor, it is preferable that the dielectric material layer DL1 is formed by a material having a superior compatibility with a channel layer material (zinc tin oxide, and the like as a non-limiting example) of the transistor and an electrode material of the capacitor (TiN, Ru, and so on as a non-limiting example). As a non-limiting example, the dielectric material layer DL1 may preferably include at least one of antimony tin oxide (ATO) and hafnium zirconium oxide (Hf—Zr—O). However, the specific material of the dielectric material layer DL1 is not limited to the above and may vary in various ways.

Next, an electrode material layer EL1 filling the second recess R2 may be formed on the dielectric material layer DL1. The electrode material layer EL1 may be formed conformally according to the surface shape of the dielectric material layer DL1 and may be deposited to a thickness which may substantially fill the second recess R2. A certain portion of the electrode material layer EL1 may be used as an electrode of a capacitor. The electrode material layer EL1 may include at least one of a metal and a metal compound. As a non-limiting example, the electrode material layer EL1 may be formed to include at least one of TiN and Ru. However, the specific material of the electrode material layer EL1 is not limited to the above descriptions and may vary in various ways.

Figure 6A:
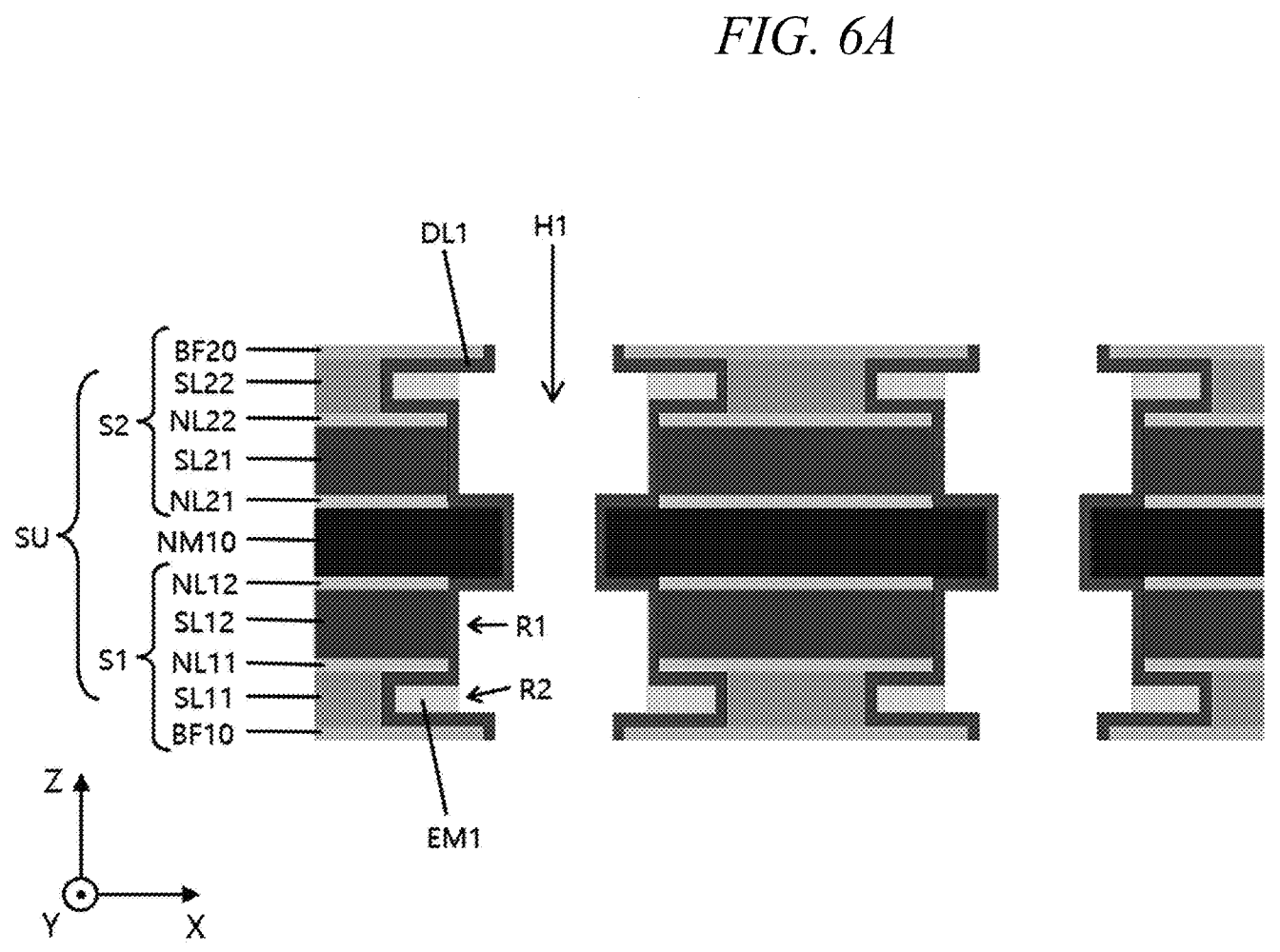
Figure 6B:
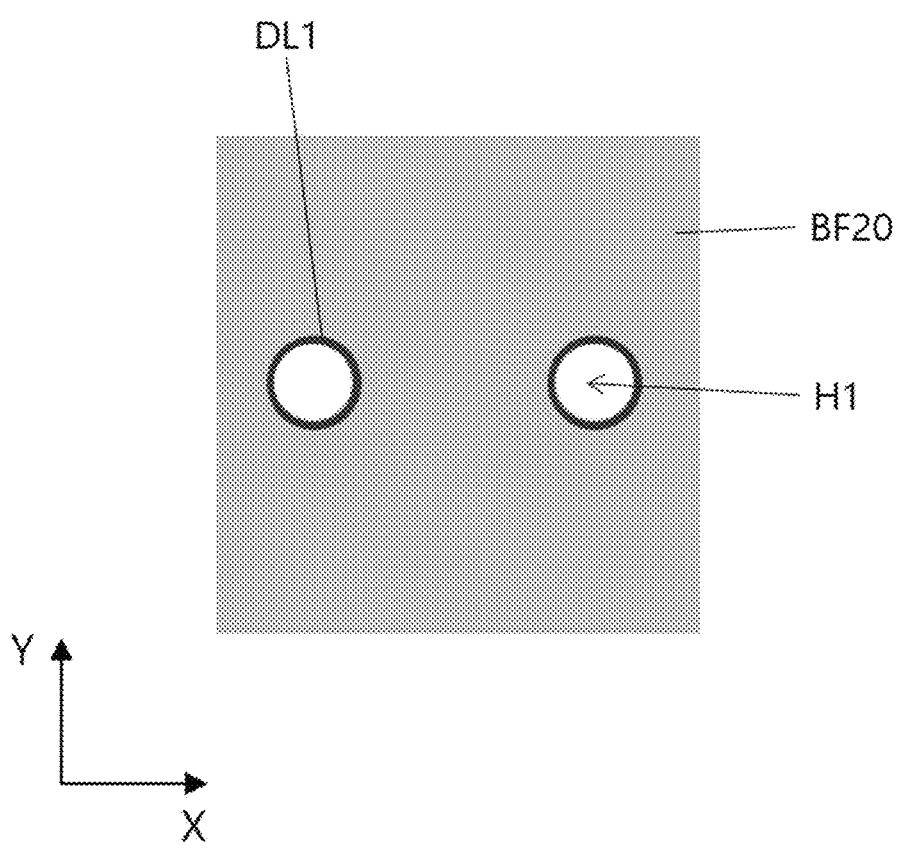

Referring to FIGS. 6A and 6B, a remaining electrode member EM1 may be formed from the electrode material layer (EL1 in FIG. 5A) by removing a remaining portion except for the portion disposed in the second recess R2 in the electrode material layer (EL1 in FIG. 5A). The electrode member EM1 may be formed by using a wet etching method. For example, the remaining portion may be removed by using the thickness difference in each region of the electrode material layer (EL1 in FIG. 5A) through a wet etching process which may remove metal or metal compounds while the electrode member EM1 provided in the second recess R2 is left as it is. The electrode member EM1 may be used as an electrode of a capacitor (i.e., a storage node member). The specific method of forming the electrode member EM1 is not limited to the method described in FIGS. 5A and 6A and may vary depending on the case.

Figure 7A:
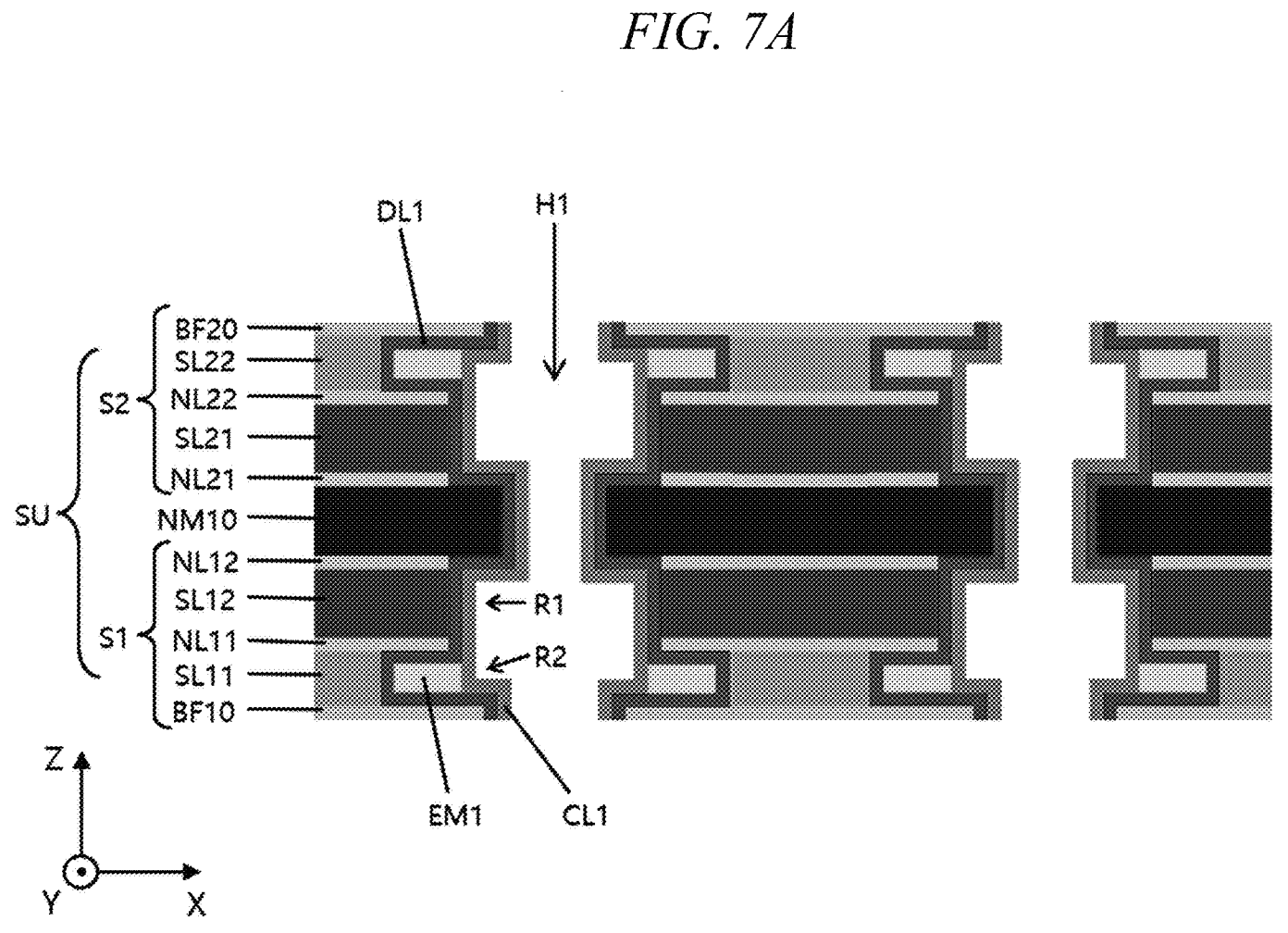
Figure 7B:
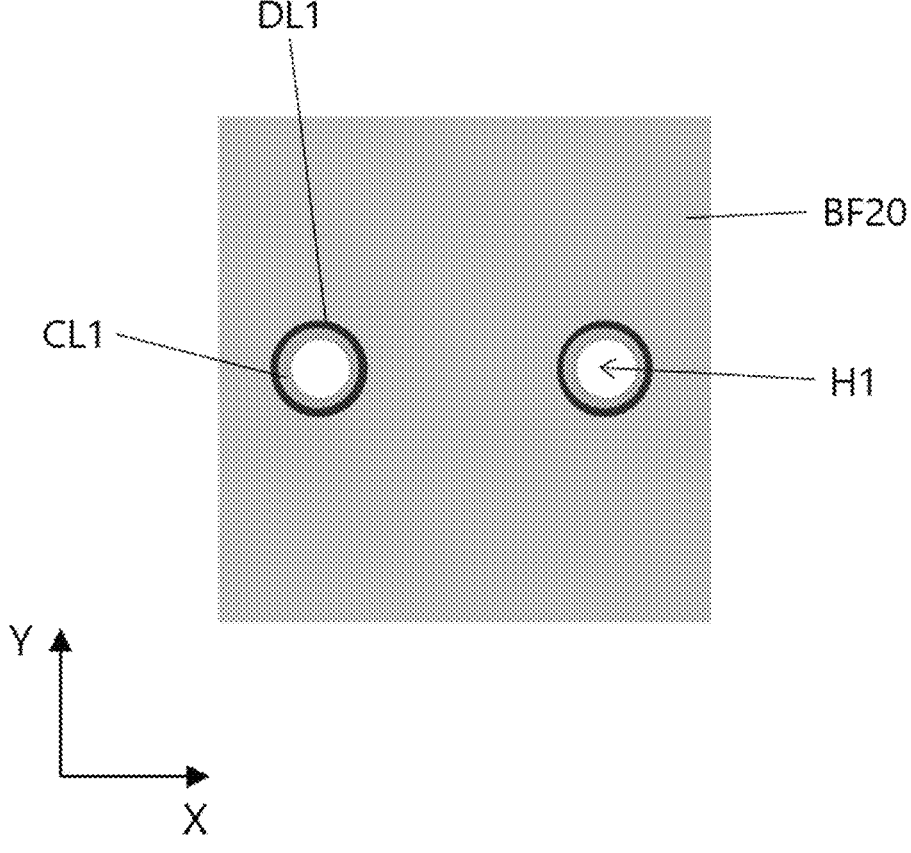

Referring to FIGS. 7A and 7B, a channel material layer CL1 may be formed on the dielectric material layer DL1 and the electrode member EM1 exposed on the inner surface of the first vertical hole H1. The channel material layer CL1 may be formed conformally according to the surface shapes of the dielectric material layer DL1 and the electrode member EM1. The channel material layer CL1 may include at least one of various semiconductor materials. The channel material layer CL1 may include an oxide semiconductor, or a silicon doped with impurities. The oxide semiconductor may include at least one selected from the group consisting of zinc tin oxide (ZTO), indium tin oxide (ITO), and indium gallium zinc oxide (IGZO). However, the specific material of the channel material layer CL1 is not limited to the above and may vary in various ways. The channel material layer CL1 may be a single layer or a multilayer. The channel material layer CL1 may be formed by using an atomic layer deposition (ALD) process, which is useful for forming a conformal thin film.

Figure 8A:
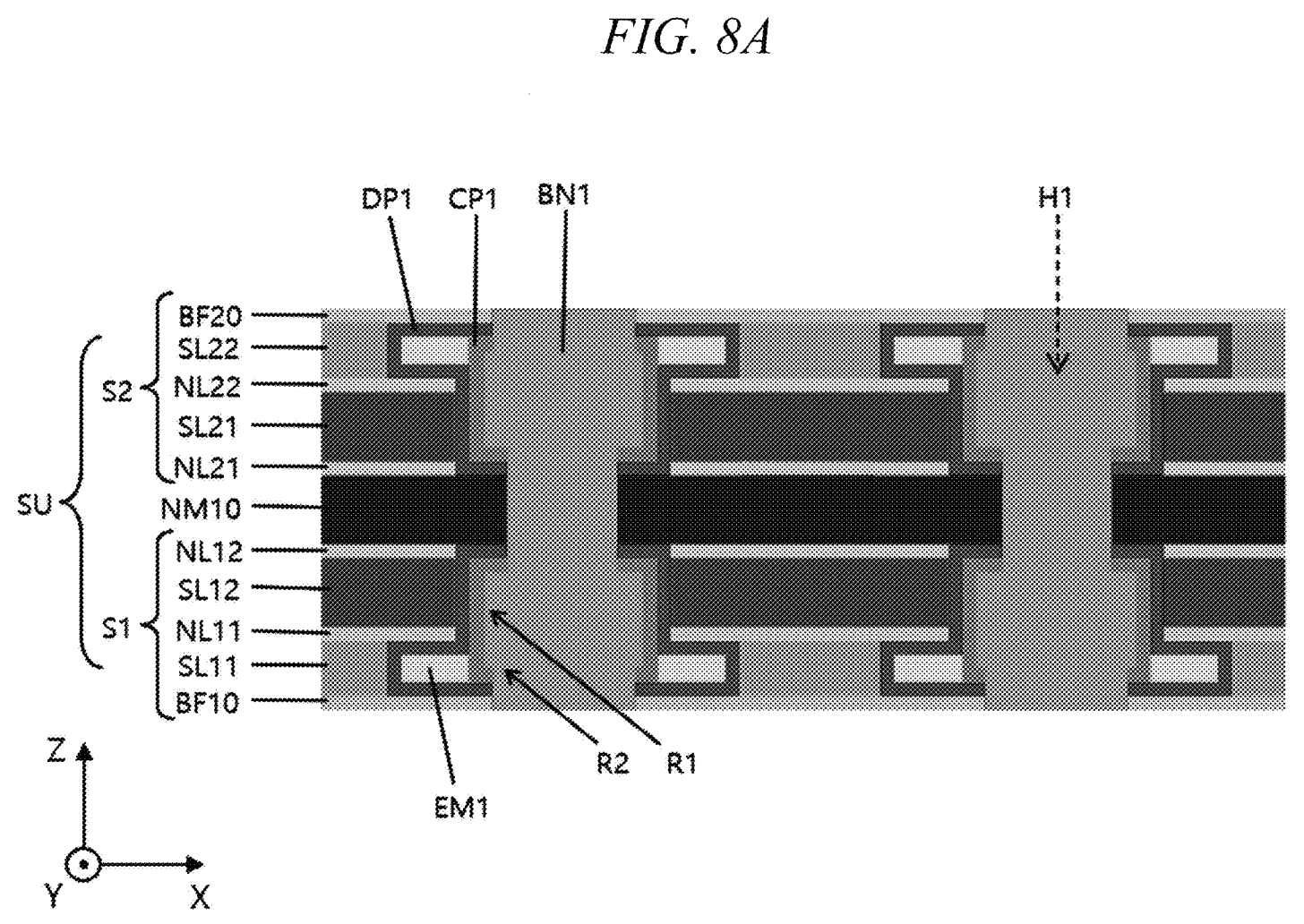
Figure 8B:
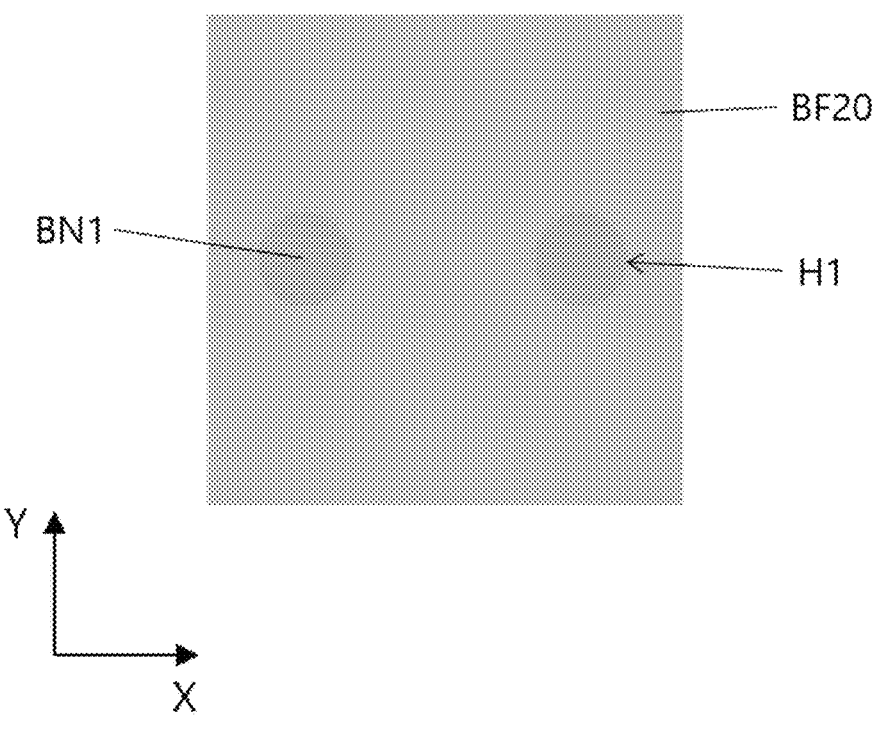

Referring to FIGS. 8A and 8B, a dielectric layer pattern DP1 may be formed from the dielectric material layer (DL1 in FIG. 7A), and a channel layer pattern CP1 may be formed from the channel material layer (CL1 in FIG. 7A) by removing the portions disposed outside the first and second recesses R1 and R2 in the dielectric material layer (DL1 in FIG. 7A) and the channel material layer (CL1 in FIG. 7A). For example, the dielectric layer pattern DP1 and the channel layer pattern CP1 may be formed by selectively removing portions of the dielectric material layer (DL1 in FIG. 7A) and the channel material layer (CL1 in FIG. 7A) formed on the side of the insulating material layer NM10 in the first vertical hole H1, and selectively removing portions of the dielectric material layer (DL1 in FIG. 7A) and the channel material layer (CL1 in FIG. 7A) formed on the sides of the upper buffer layer BF20 and the lower buffer layer BF10 by using a dry etching (anisotropic etching) method. This may be a process for separating the nodes of cells. The dielectric layer pattern DP1 and the channel layer pattern CP1 may be formed in the first and second recesses R1 and R2 of the upper stack S2. Furthermore, the dielectric layer pattern DP1 and the channel layer pattern CP1 may be formed in the first and second recesses R1 and R2 of the lower stack S1.

Then, a body insulating layer BN1 may be formed to cover the channel layer pattern CP1 and the dielectric layer pattern DP1 and to fill the first vertical hole H1. The body insulating layer BN1 may include an insulating material such as a silicon oxide.

Figure 9A:
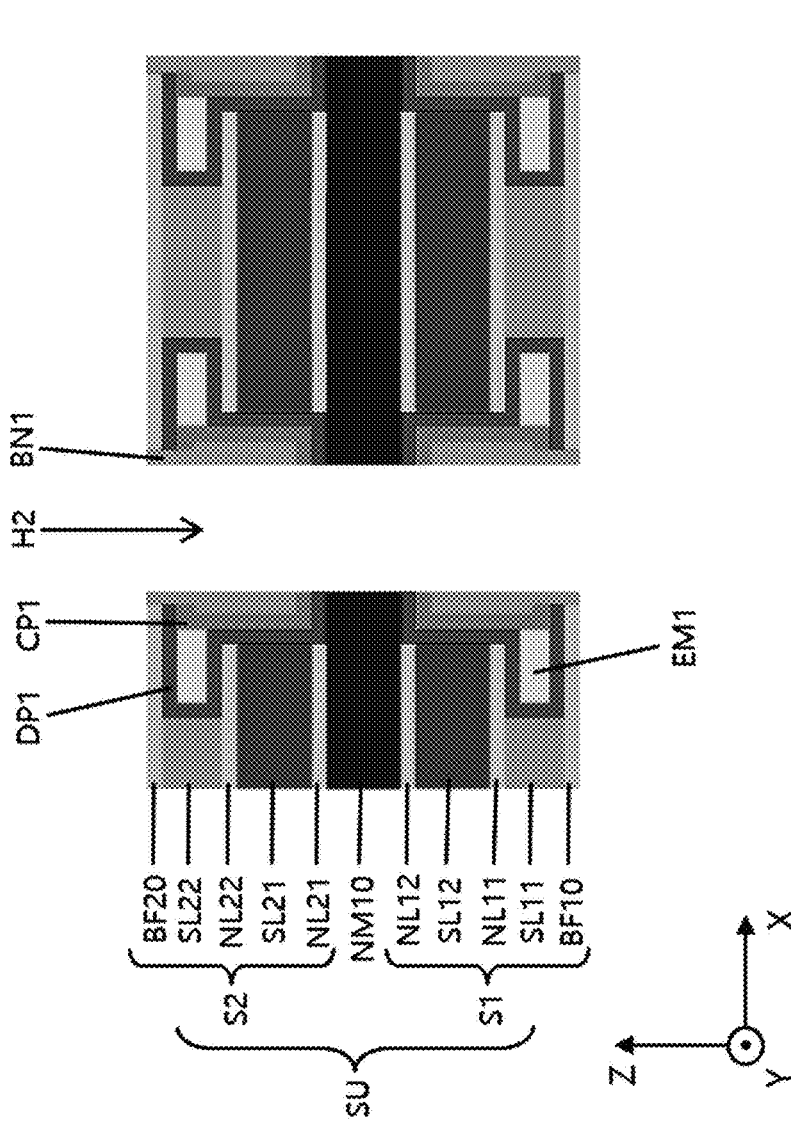
Figure 9B:
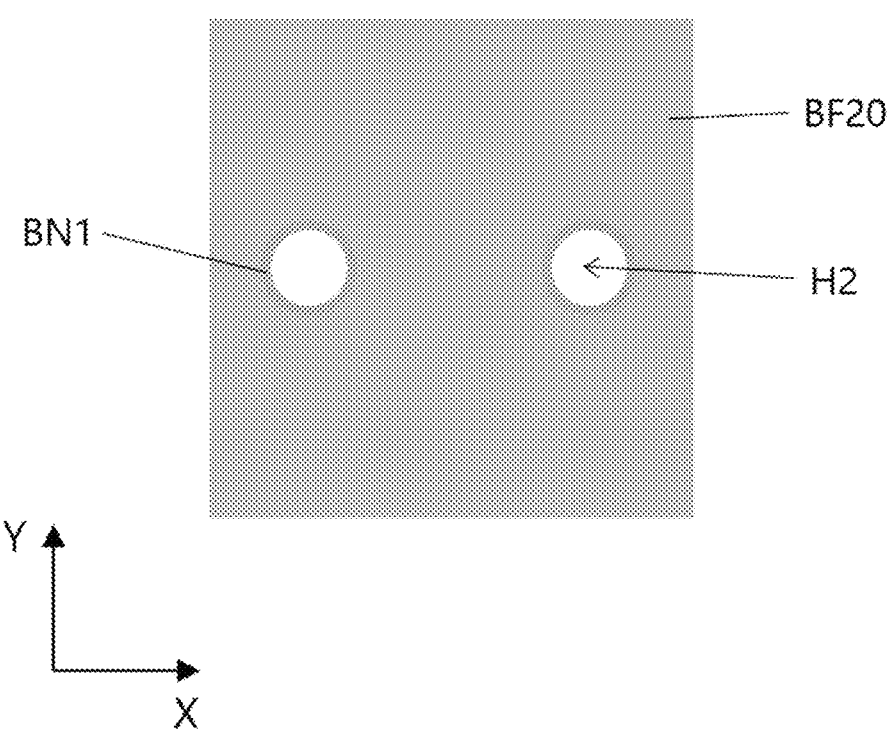

Referring to FIGS. 9A and 9B, a second vertical hole H2 which penetrates through the body insulating layer BN1 and exposes one end of the channel layer pattern CP1 may be formed. The second vertical hole H2 may be formed by etching a central portion or an approximate central portion of the body insulating layer BN1 using a dry etching method. The second vertical hole H2 may be formed to expose the side surface of the insulating material layer NM10. The second vertical hole H2 may be formed to expose one end portion of each of the channel layer pattern CP1 and the dielectric layer pattern DP1 adjacent to the insulating material layer NM10.

Figure 10A:
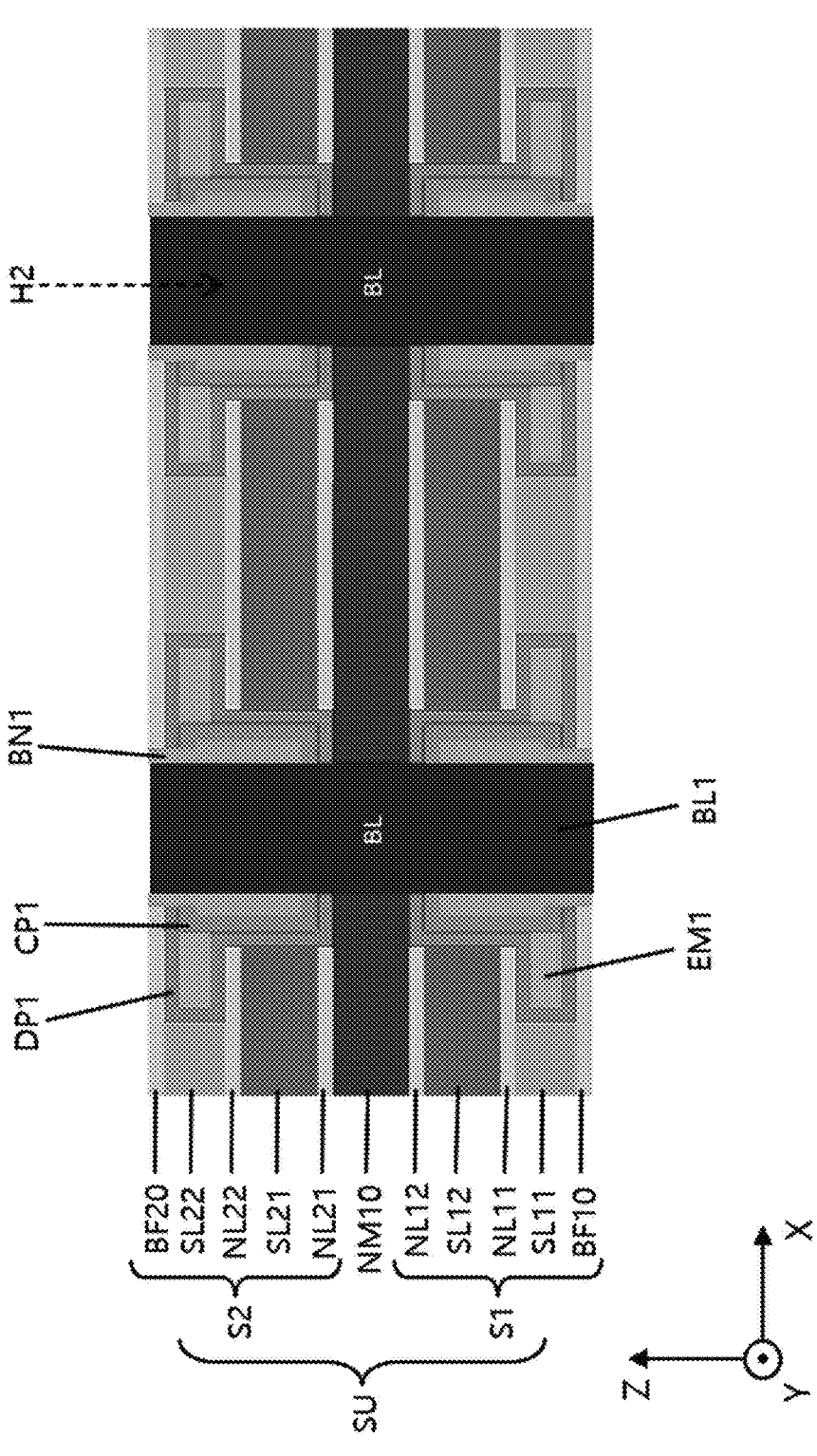
Figure 10B:
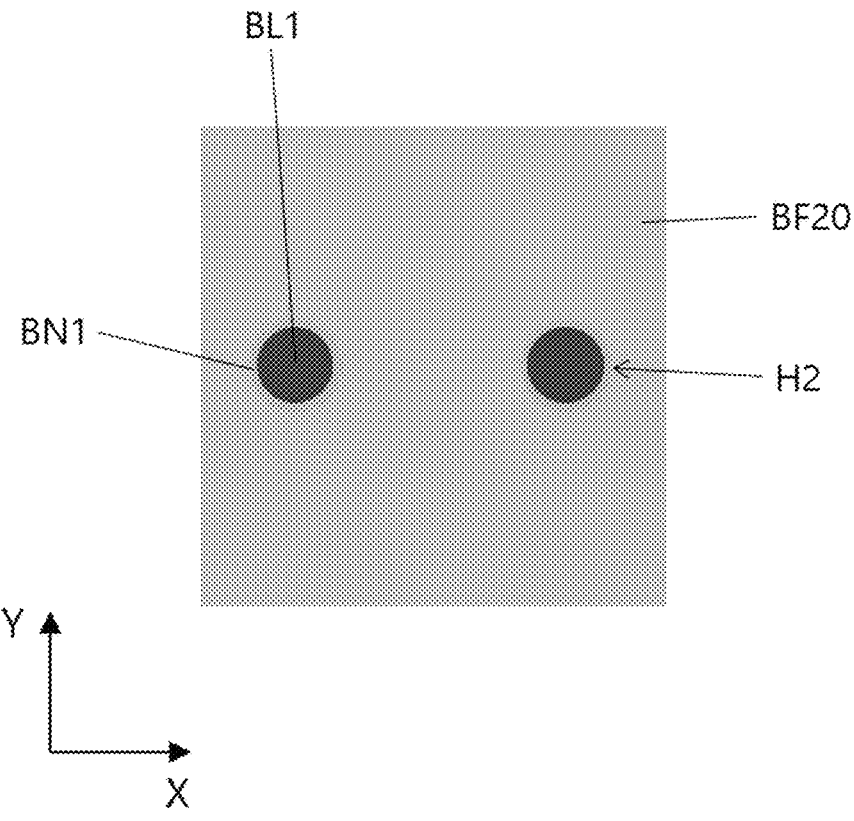

Referring to FIGS. 10A and 10B, a vertical bit line BL1 may be formed to fill the second vertical hole H2. The vertical bit line BL1 may have a pillar (e.g., cylinder) shape penetrating from the upper stack S2 to the lower stack S1. The vertical bit line BL1 may be electrically connected to one end of the channel layer pattern CP1 in the lateral direction. Although not shown, if the insulating material of the body insulation layer BN1 and the conductive material of the vertical bit line BL1 deposited above the second vertical hole H2 exist, for example, these may be removed through an etch back process.

Figure 11A:
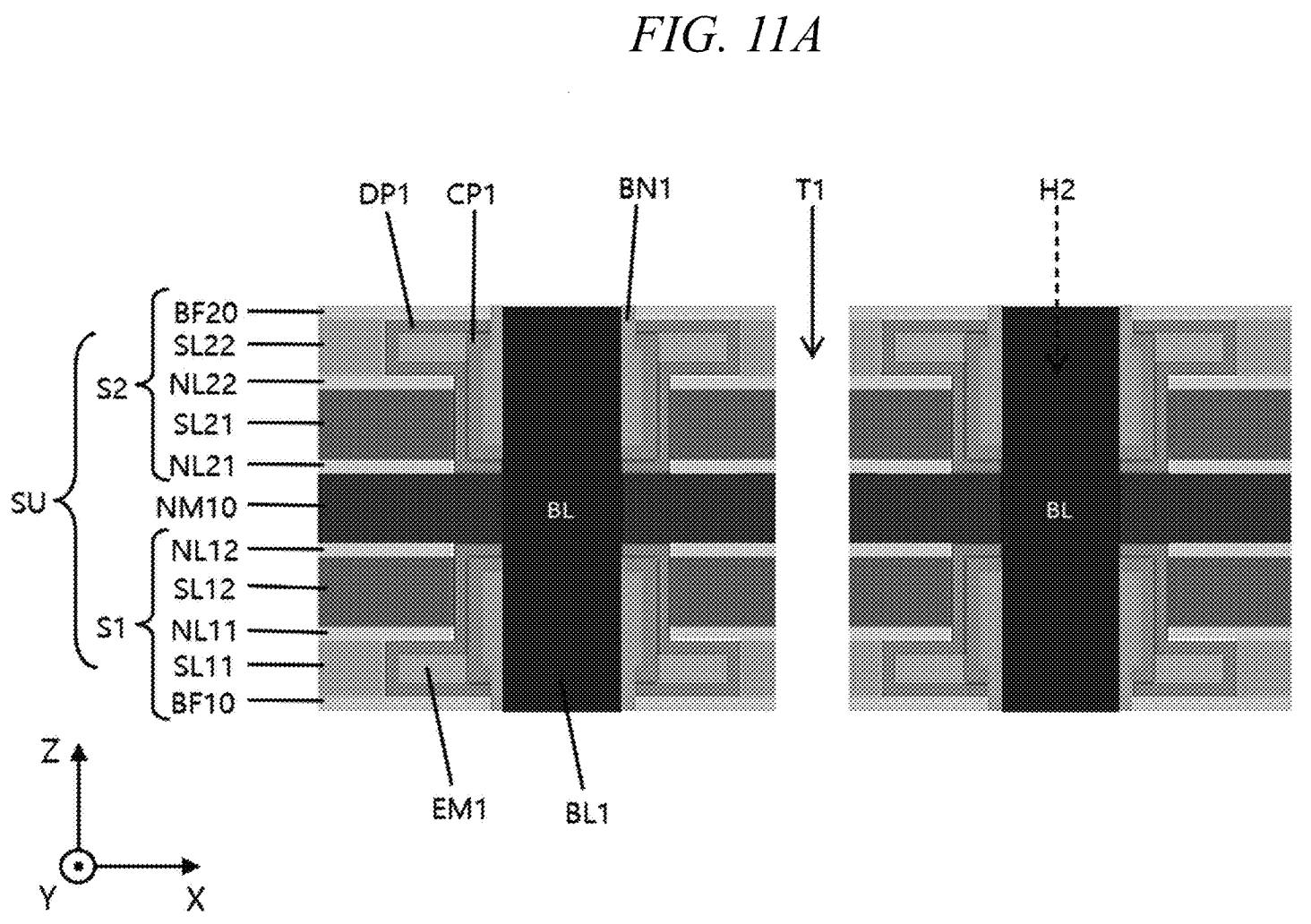
Figure 11B:
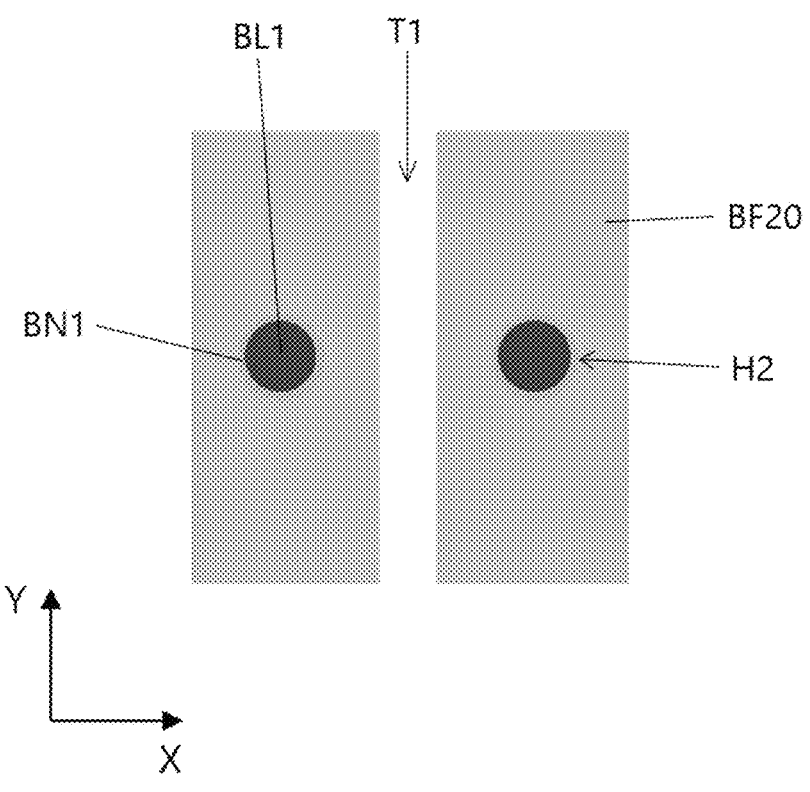

Referring to FIGS. 11A and 11B, a portion of the upper stack S2 may be selectively removed to form a first trench T1 extending in one direction, for example, the Y-axis direction. The selective removal process may include a dry etching process. The first trench T1 may be arranged to be spaced apart from the vertical bit line BL1. The first trench T1 may be disposed outside the dielectric layer pattern DP1 while being spaced away from the vertical bit line BL1.

The first trench T1 may be formed to penetrate through the stack unit SU. The first trench T1 may be formed between the vertical bit line BL1 and another vertical bit line BL1 adjacent thereto. The first trench T1 may be formed to separate one unit cell area including the vertical bit line BL1 from another unit cell area adjacent thereto.

Figure 12A:
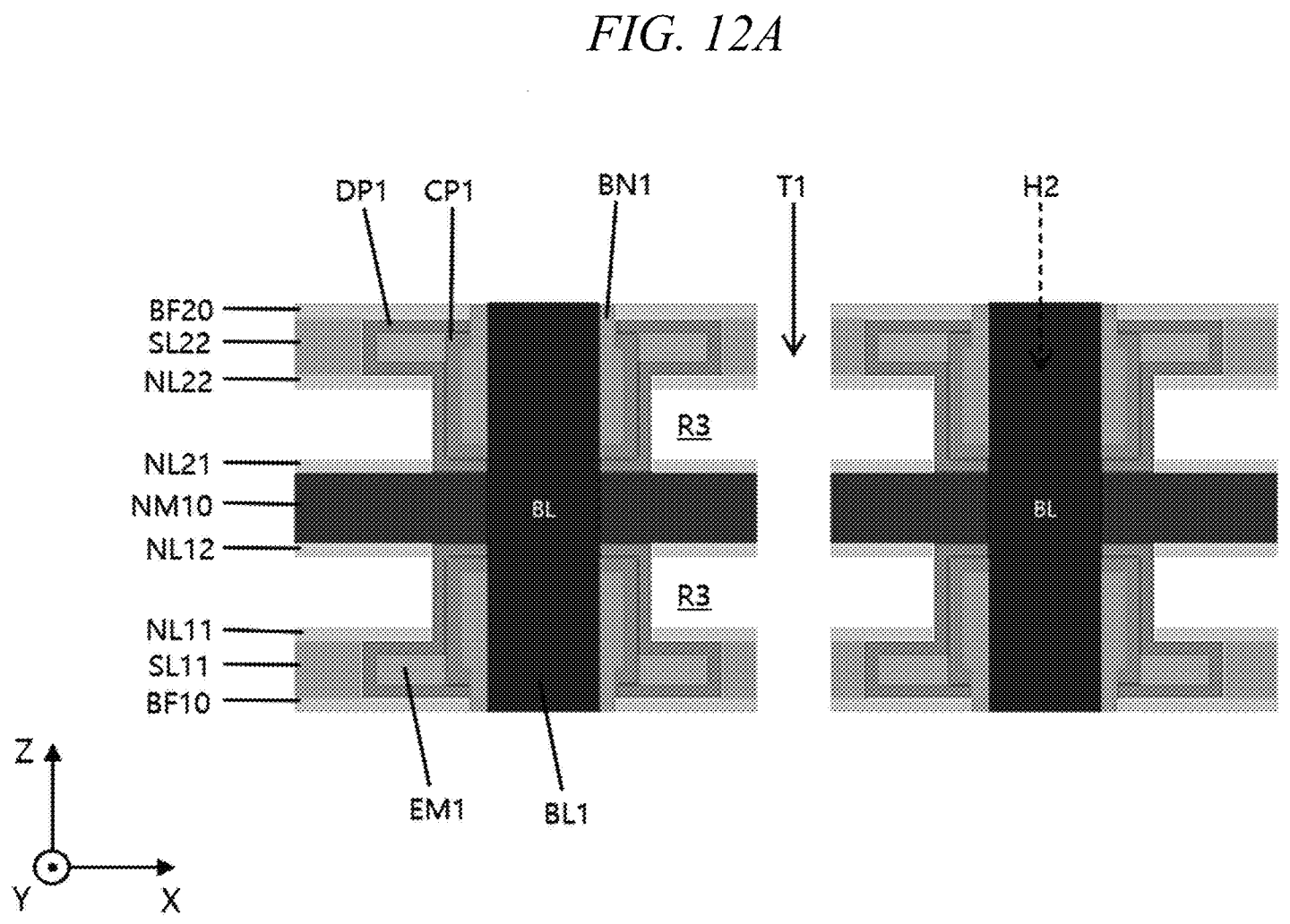
Figure 12B:
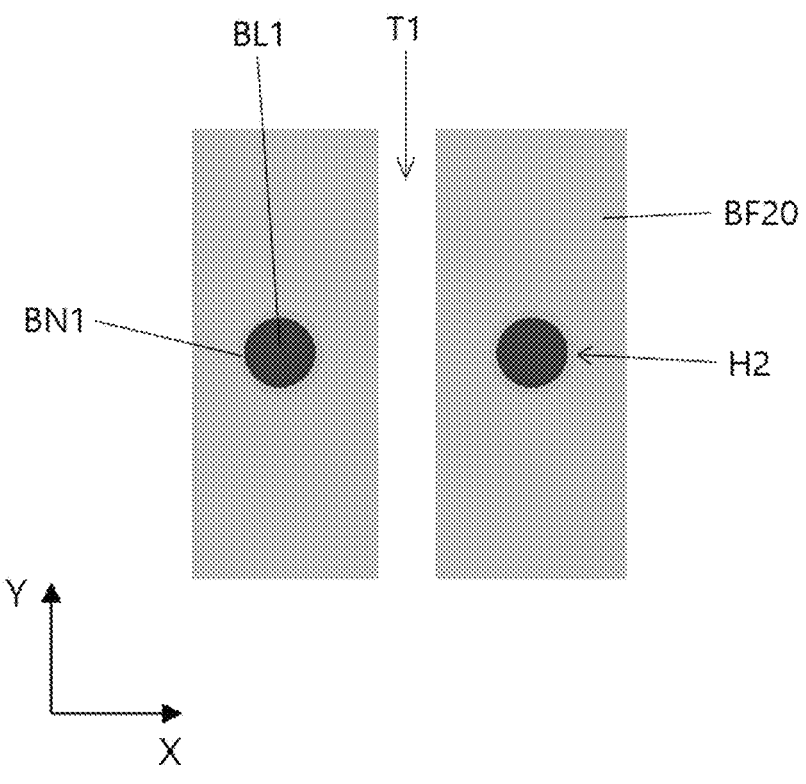

Referring to FIGS. 12A and 12B, the first upper sacrificial layer SL21 and the second lower sacrificial layer SL12 exposed by the first trench T1 may be removed to form a third recess (third recess portion) R3. The first upper sacrificial layer SL21 and the second lower sacrificial layer SL12 may be selectively removed by injecting an etching solution having selectivity through the first trench T1.

Figure 13A:
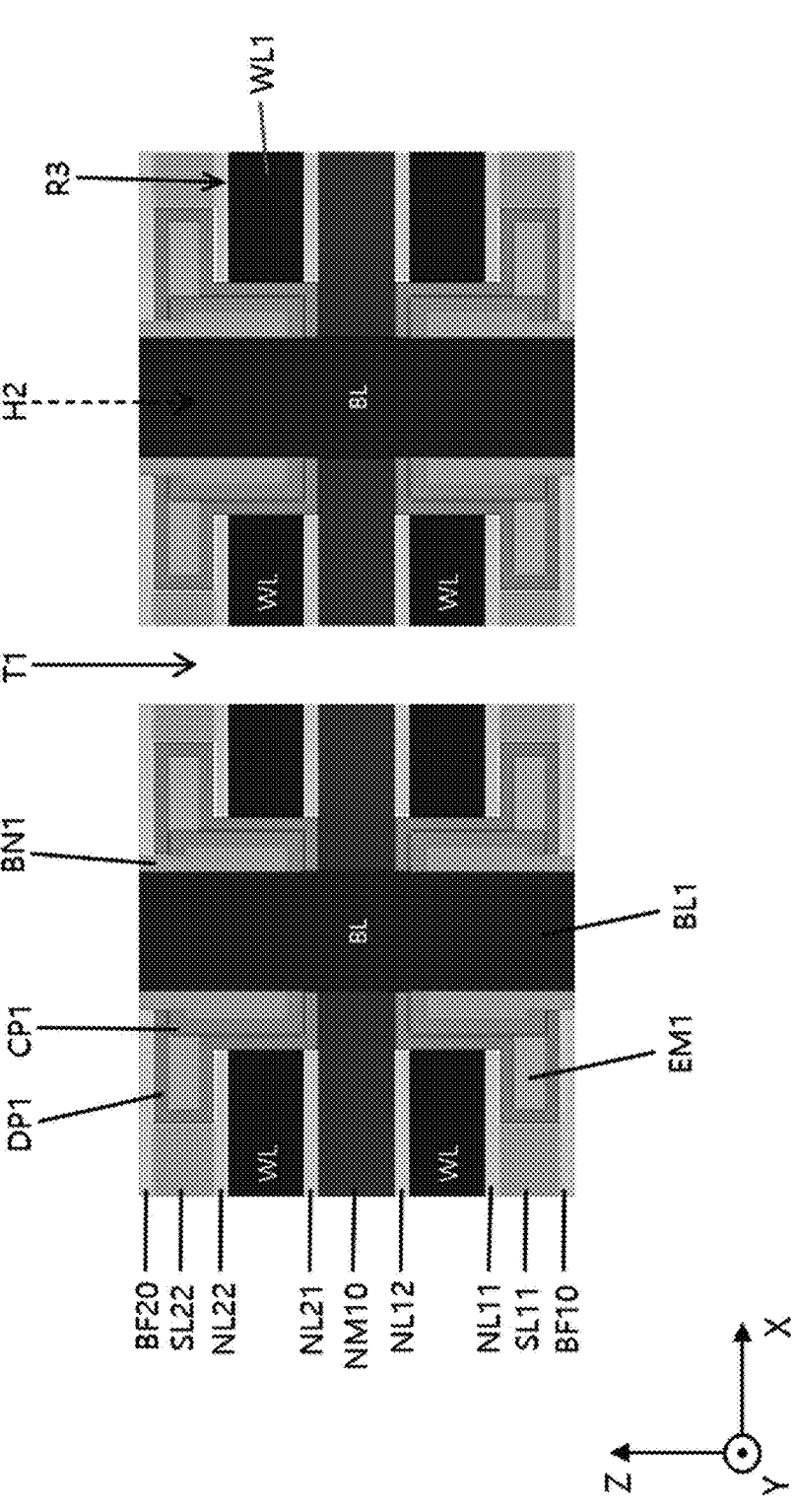
Figure 13B:
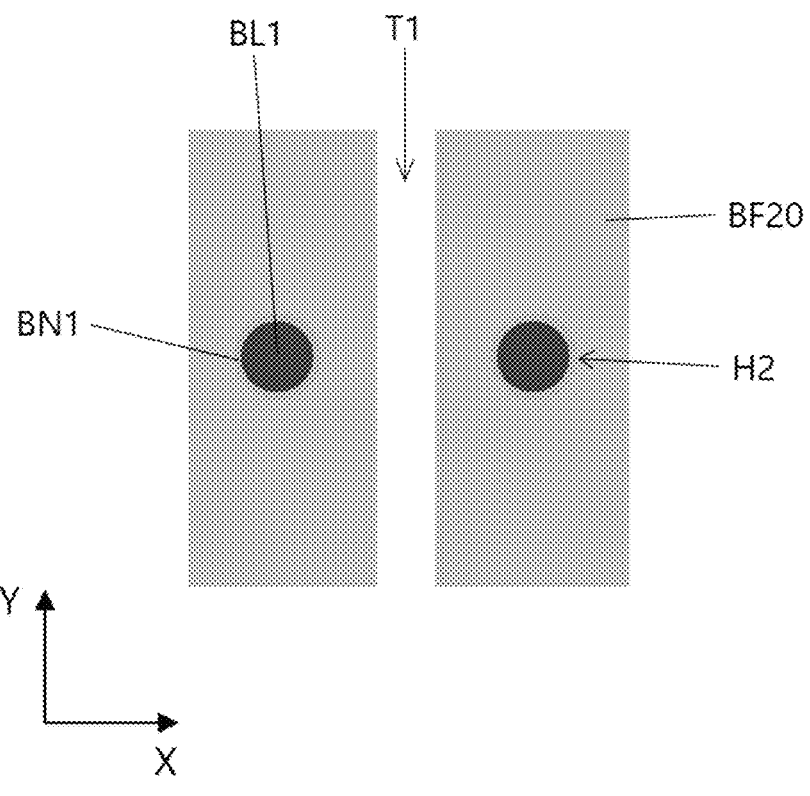

Referring to FIGS. 13A and 13B, the word line WL1 may be formed to fill the third recess R3. The word line WL1 may be formed to fill the third recess R3 located in each of the upper stack S2 and the lower stack S1. After depositing a conductive material for the word line which fills the third recess R3 and the first trench T1, a space of the first trench T1 or a space substantially corresponding to it may be secured again by removing the conductive material portion formed in the first trench T1 through a dry etching process. When the conductive material is deposited on the upper surface of the upper stack S2, the conductive material present on the upper surface of the upper stack S2 may also be removed. For example, the word line WL1 may include at least one metal, metal compound, and conductive silicon.

Figure 14A:
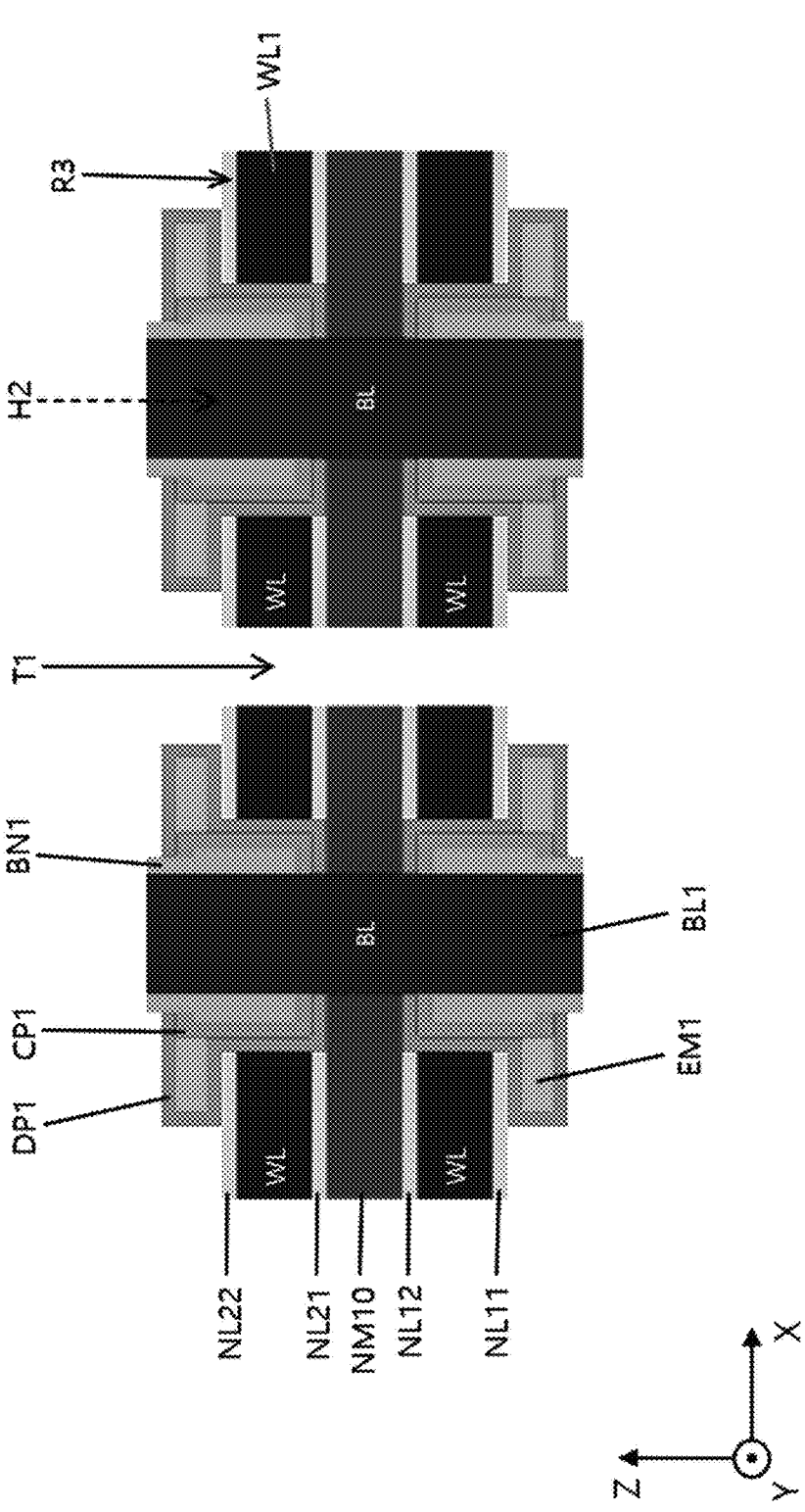
Figure 14B:
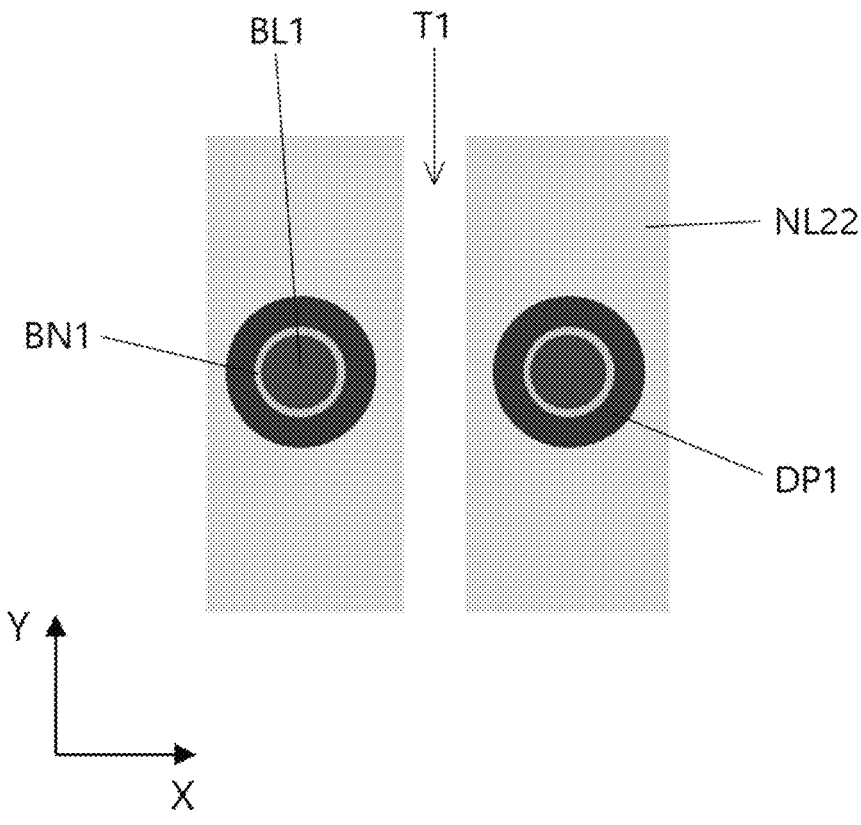

Referring to FIGS. 14A and 14B, the second upper sacrificial layer (SL22 in FIG. 13A) and the upper buffer layer (BF20 in FIG. 13A) may be removed to expose a portion of the dielectric layer pattern DP1 disposed on the upper portion. In addition, the first lower sacrificial layer (SL11 in FIG. 13A) and the lower buffer layer (BF10 in FIG. 13A) may be removed to expose a portion of the dielectric layer pattern DP1 disposed below.

The second upper sacrificial layer (SL22 in FIG. 13A) and the first lower sacrificial layer (SL11 in FIG. 13A) may be removed together, and then, the upper buffer layer (BF20 in FIG. 13A) and the lower buffer layer (FIG. BF10) of 13a may be removed together. Alternatively, after removing the upper buffer layer (BF20 in FIG. 13A) and the lower buffer layer (BF10 in FIG. 13A), the second upper sacrificial layer (SL22 in FIG. 13A) and the first lower sacrificial layer (SL11 in FIG. 13A) may also be removed together. The second upper sacrificial layer (SL22 in FIG. 13A) and the first lower sacrificial layer (SL11 in FIG. 13A) may be removed together by using an etching solution having selectivity. Furthermore, the upper buffer layer (BF20 in FIG. 13A) and the lower buffer layer (BF10 in FIG. 13A) may be removed together by using another etching solution having selectivity.

The exposed portion of the dielectric layer pattern DP1 may have an annular structure surrounding the vertical bit line BL1 and may have a bent shape. This portion may have an expanded form by the second recess (R2 in FIG. 4A). Accordingly, the exposed portion of the dielectric layer pattern DP1 may be advantageous in securing a sufficiently large capacitor area (contact area).

Figure 15A:
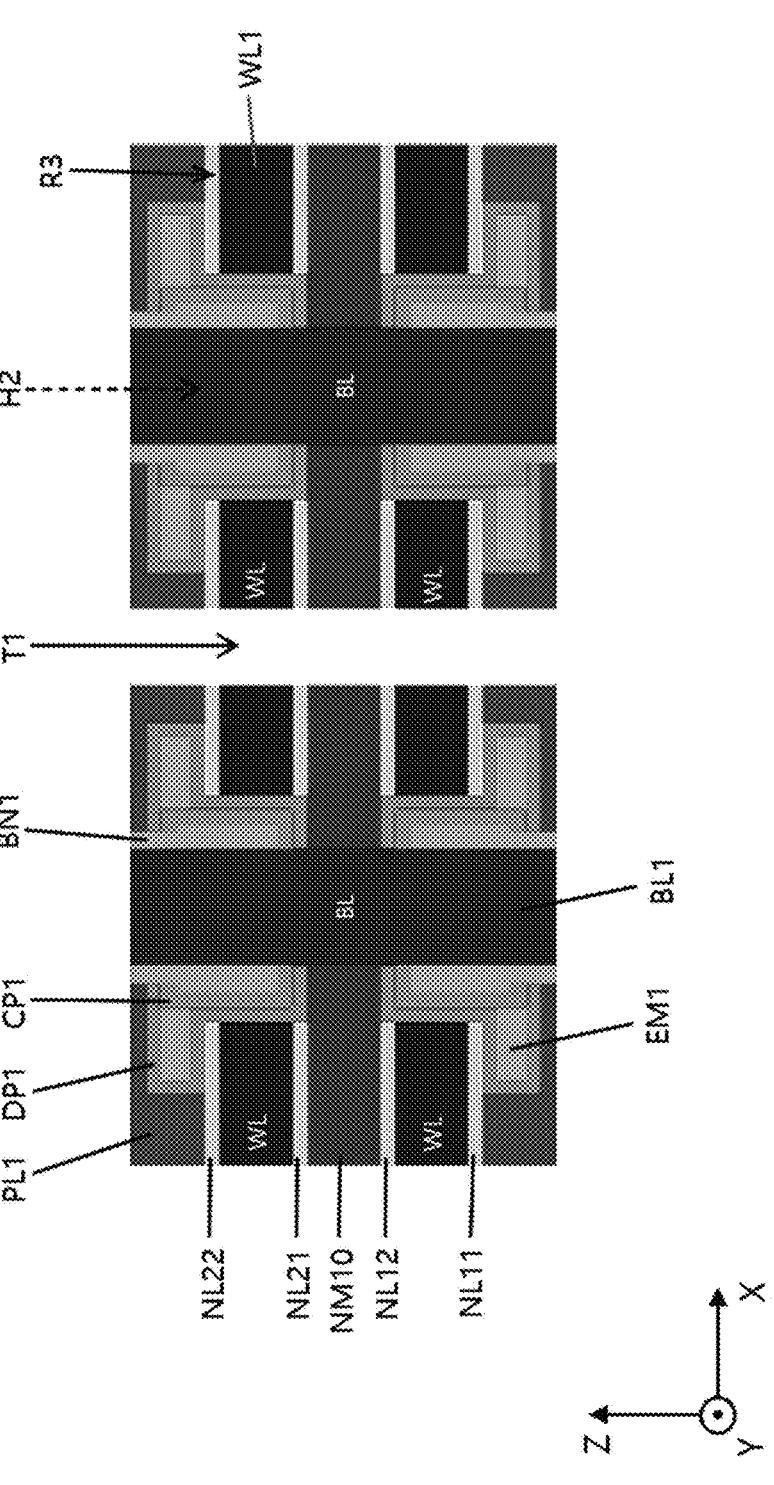
Figure 15B:
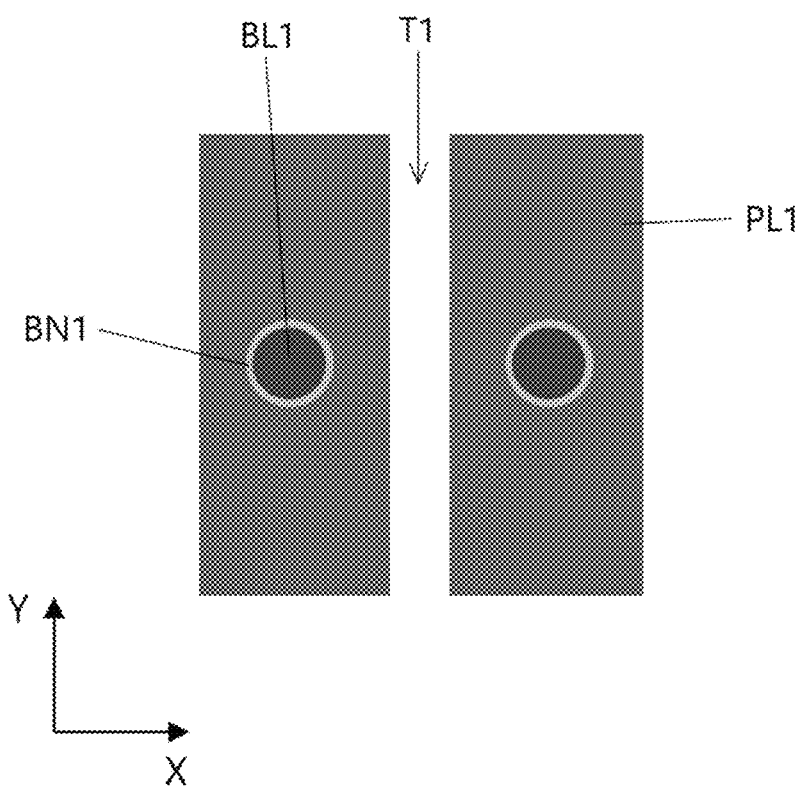

Referring to FIGS. 15A and 15B, a plate electrode PL1 in contact with the exposed portion of the dielectric layer pattern DP1 may be formed. A plate electrode PL1 in contact with the upper dielectric layer pattern DP1 may be formed on the upper surface of the second upper insulating layer NL22. Furthermore, a plate electrode PL1 in contact with the lower dielectric layer pattern DP1 may be formed on the lower surface of the first lower insulating layer NL11. The conductive material for the plate electrode may be formed to fill the empty space while contacting the dielectric layer pattern DP1, and in this case, the first trench T1 may also be filled with the conductive material. The conductive material formed in the first trench T1 may be removed through a dry etching process, and the space of the first trench T1 or a space substantially corresponding thereto may be secured again. If the conductive material is deposited above the upper surface of the vertical bit line BL1, the corresponding portion of the conductive material may also be removed. The plate electrode PL1 may be formed to include one or more of various electrode materials used in semiconductor device processing. The plate electrode PL1 may have a type of line shape. Therefore, the plate electrode PL1 may be said to be a plate electrode line.

A first region of the channel layer pattern CP1 may be connected to the vertical bit line BL1, and a second region of the channel layer pattern CP1 may be connected to the electrode member EM1. The electrode member EM1 may have a ring-shaped structure surrounding the second region of the channel layer pattern CP1. The dielectric layer pattern DP1 may extend between the channel layer pattern CP1 and the word line WL1, and may have an extended structure to surround the electrode member EM1. The electrode member EM1 may be completely surrounded by the dielectric layer pattern DP1 and the channel layer pattern CP1.

In an area above the insulating material layer NM10, the word line WL1, the channel layer pattern CP1, a first portion of the dielectric layer pattern DP1 disposed between the word line WL1 and the channel layer pattern CP1, and at least a portion of the vertical bit line BL1 may constitute an 'upper cell transistor', and the electrode member EM1, the plate electrode PL1, and a second portion of the dielectric layer pattern DP1 disposed between the electrode member EM1 and the plate electrode PL1 may constitute an 'upper cell capacitor.' The upper cell transistor and the upper cell capacitor may constitute an 'upper memory cell'.

A 'lower memory cell' having a structure in which the upper memory cell is upside down may be provided under the insulating material layer NM10. The lower memory cell may include a 'lower cell transistor' having a structure in which the upper cell transistor is vertically upside down (inverted), and a 'lower cell capacitor' having a structure in which the upper cell capacitor is vertically upside down (inverted). In an area under the insulating material layer NM10, the word line WL1, the channel layer pattern CP1, a first portion of the dielectric layer pattern DP1 disposed between the word line WL1 and the channel layer pattern CP1, and at least a portion of the vertical bit line BL1 may constitute the 'lower cell transistor', and the electrode member EM1, the plate electrode PL1, and a second portion of the dielectric layer pattern DP1 disposed between the electrode member EM1, the plate electrode PL1 may constitute the 'lower cell capacitor'.

According to embodiments of the present invention, it is possible to implement a vertical stack-type memory device which may significantly improve integration degree and have excellent performance and operation characteristics. In particular, in the vertical stack-type memory device according to embodiments of the present invention, the electrode member and the channel layer pattern are independently formed in a three-dimensional stacked structure, and each of the electrode member and the channel layer pattern are formed in a predetermined form according to a predetermined method. Thus, the operating characteristics and performance of the capacitor including the electrode member and the transistor including the channel layer pattern may be improved. The vertical stack-type memory device according to an embodiment of the present invention may be a vertical-type DRAM device or a three-dimensional DRAM device.

FIG. 16 to FIG. 26 are diagrams schematically showing a manufacturing method of a vertical stack-type memory device according to an embodiment of the present invention.

Figure 16:
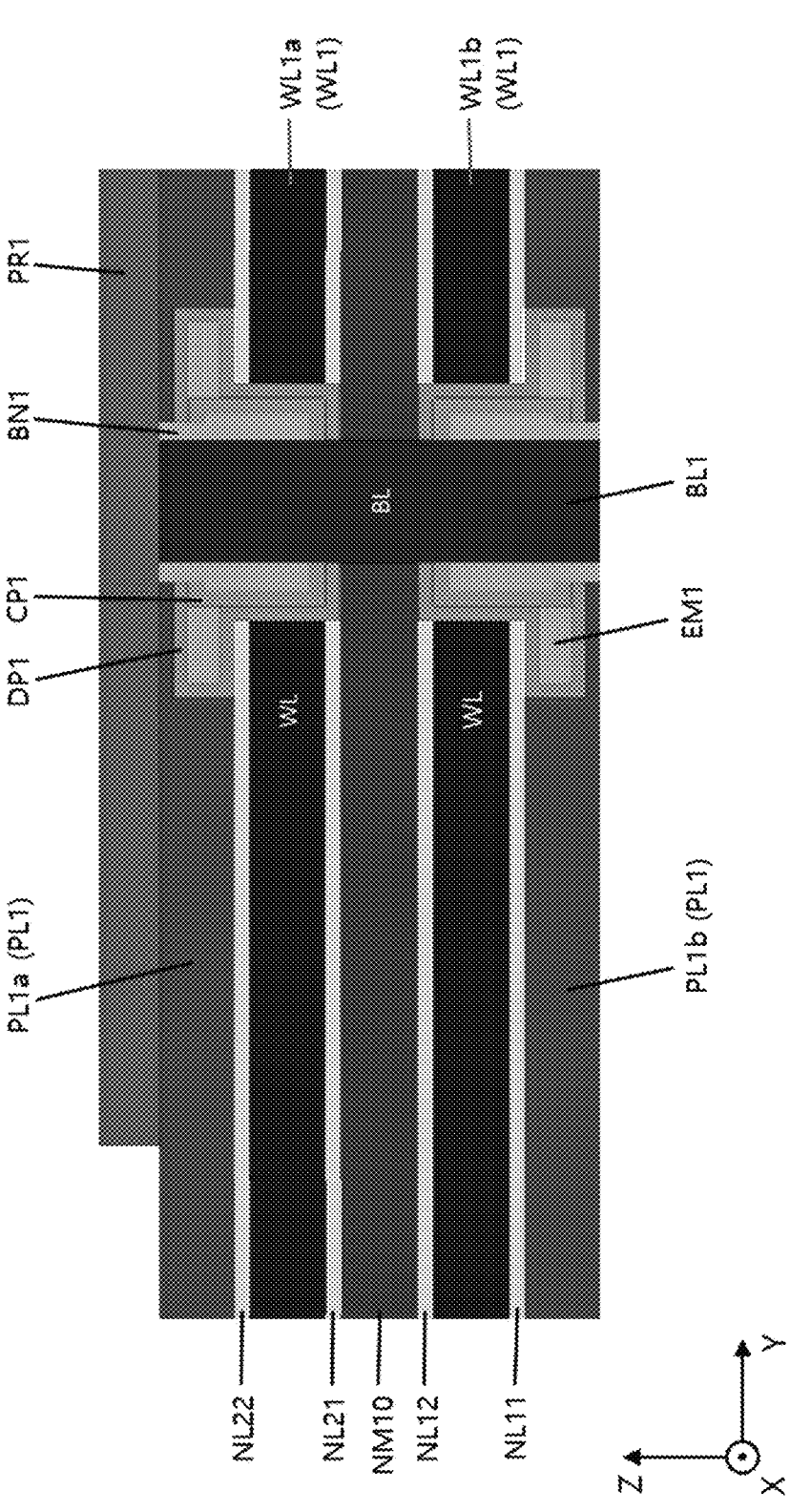

Referring to FIG. 16, a device structure as described in FIGS. 15A and 15B may be prepared. FIG. 16 shows the device structure in the direction in which the plate electrode PL1 extends in FIG. 15A, that is, in the direction in which the word line WL1 extends. In the structure of FIG. 16, for convenience, the upper word line WL1 is called as a first word line WL1a, and the lower word line WL1 is called as a second word line WL1b. Furthermore, the upper plate electrode PL1 is called as a first plate electrode PL1a, and the lower plate electrode PL1 is called as a second plate electrode PL1b. This may be the same as the description of FIGS. 16 to 26.

A first photoresist pattern PR1 may be formed on the plate electrode PL1 located on the uppermost layer, that is, the first plate electrode PL1a. The first photoresist pattern PR1 may be formed to expose a portion (e.g., one end portion) of the first plate electrode PL1a. The first photoresist pattern PR1 may cover the vertical bit line BL1 and a portion of the first plate electrode PL1a adjacent thereto.

Figure 17:
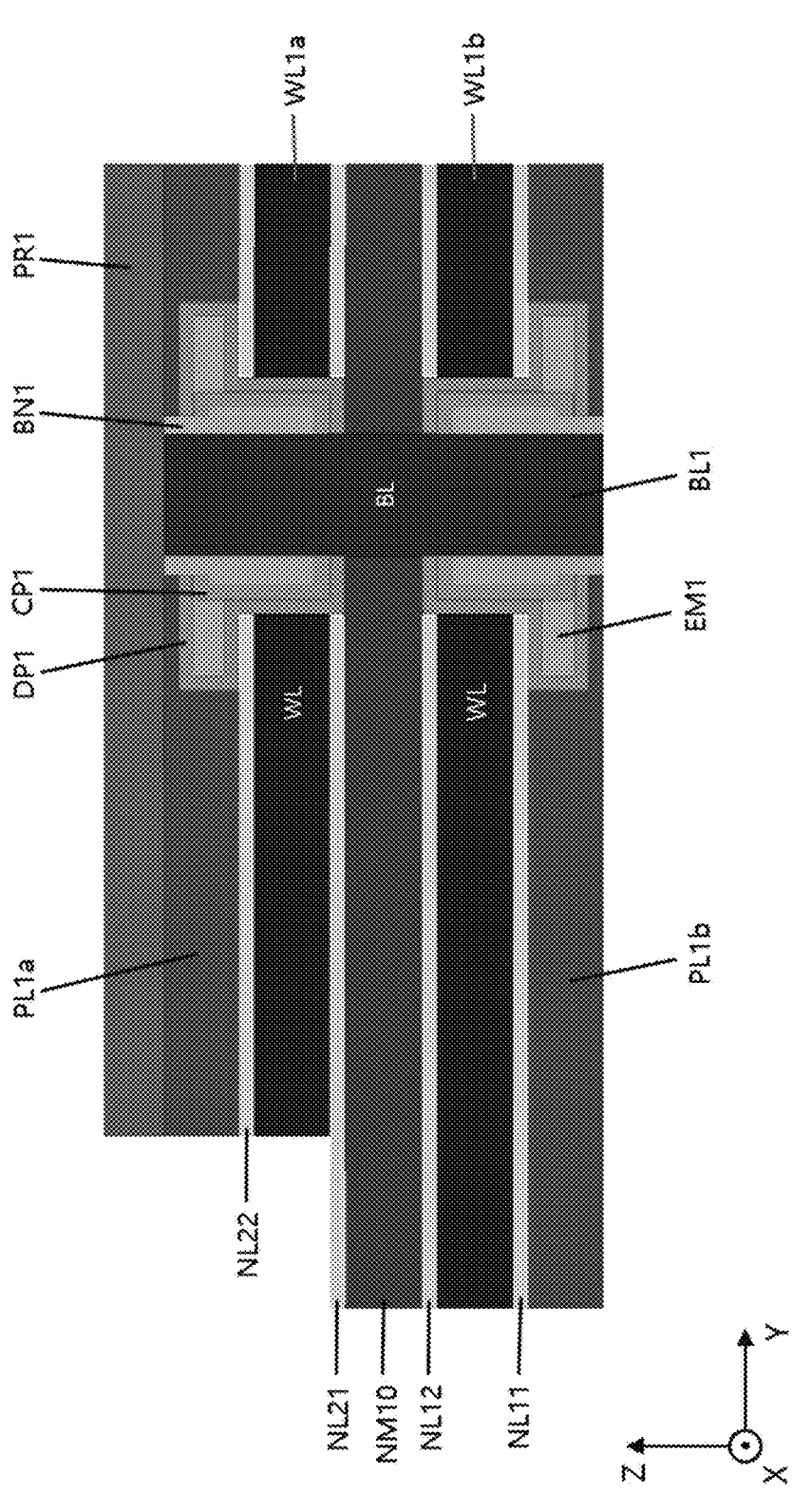

Referring to FIG. 17, a portion of the first plate electrode PL1a, a portion of the second upper insulating layer NL22, and a portion of the first word line WL1a may be removed through an etching process by performing an etching process using the first photoresist pattern PR1 as an etch mask. The etching process may be performed by a dry etching method under a selectivity condition. As a result of the etching process, a portion of the upper surface of the first upper insulating layer NL21 may be exposed. It may be understood that a portion of the stacked structure consisting of the plurality of plate electrodes PL1a, PL1b, the plurality of word lines WL1a, WL1b, the insulating material layer NM10, the first and second lower insulating layers NL11, NL12, and the first and second upper insulating layers NL21 and NL22 is removed through the etching process, and a groove portion (a type of stepped groove) is formed.

Figure 18:
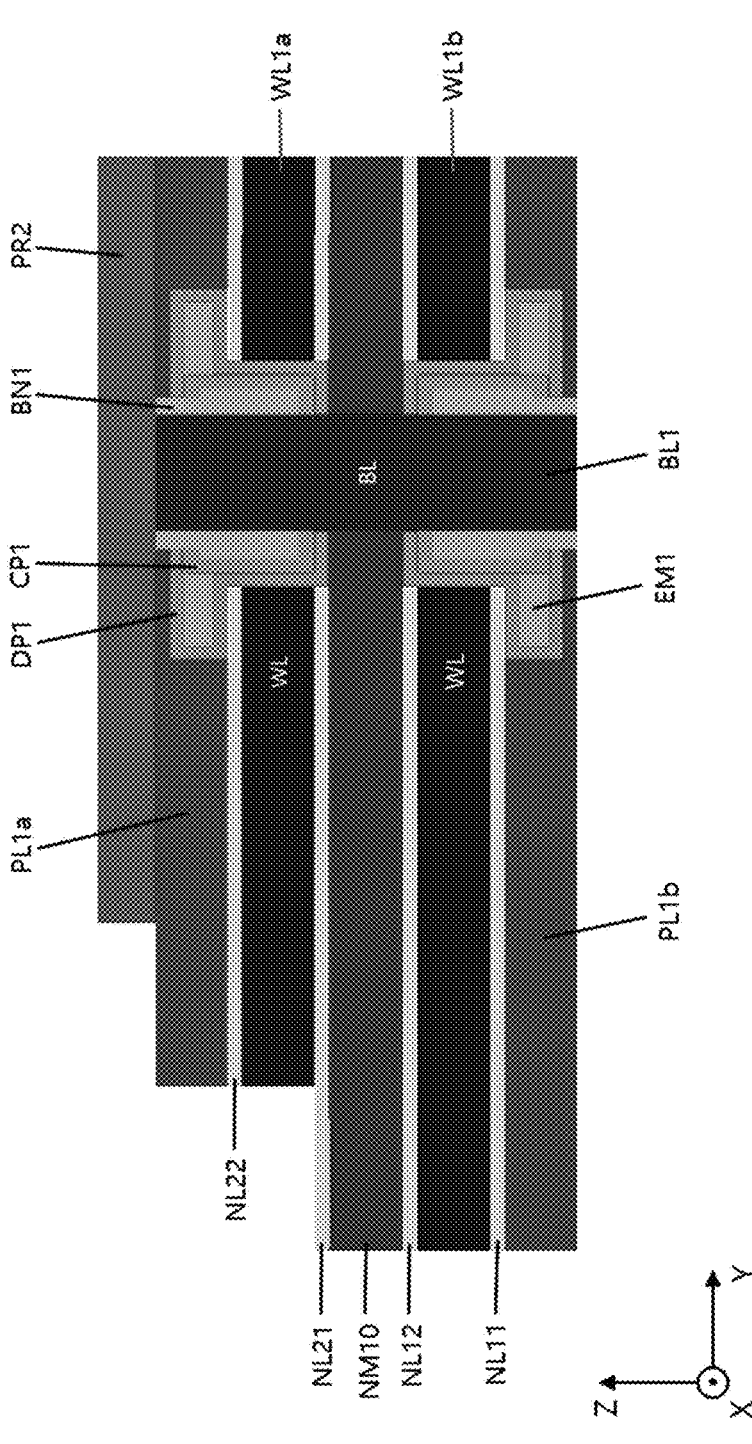

Referring to FIG. 18, a second photoresist pattern PR2 having a smaller width (length) than that of the first photoresist pattern (PR1 in FIG. 17) may be formed. The second photoresist pattern PR2 may be formed to expose a portion (e.g., one end portion) of the first plate electrode PL1a. The second photoresist pattern PR2 may have a shape and size which exposes the groove portion formed by etching in the step of FIG. 17 and a portion of the first plate electrode PL1a adjacent thereto. The second photoresist pattern PR2 may be formed through various processes. For example, the second photoresist pattern PR2 may be formed by shrinking the first photoresist pattern (PR1 in FIG. 17), that is, by reducing the width of the first photoresist pattern (PR1 in FIG. 17).

Figure 19:
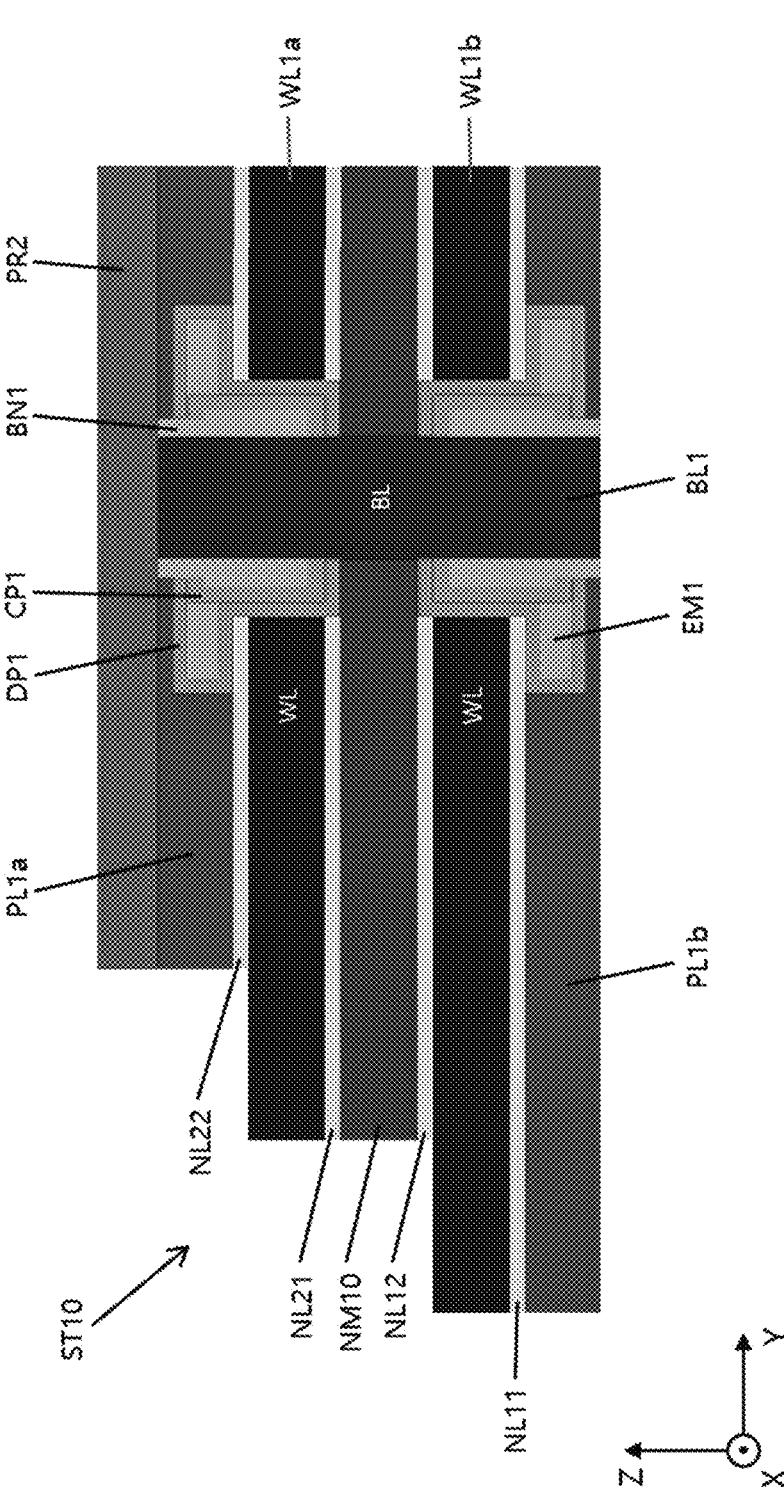

Referring to FIG. 19, a portion of the first plate electrode PL1a and a portion of the second upper insulating layer NL22 may be etched, and a portion of the first upper insulating layer NL21, a portion of the insulating material layer NM10, and a portion of the second lower insulating layer NL12 may be etched by an etching process using the second photoresist pattern PR2 as an etch mask. The etching process may be performed by using a dry etching (aniso-tropic etching) method with selectivity. In this step, the word lines WL1a, WL1b may act as an etch stop layer. As a result of the etching process, the upper surfaces of each of the first and the second word lines WL1a and WL1b may be exposed. Through the etching process, it may be understood that a portion the stacked structure consisting of the plurality of plate electrodes PL1a, PL1b, the plurality of word lines WL1a, WL1b, the insulating material layer NM10, the first and second lower insulating layers NL11, NL12, and the first and second upper insulating layers NL21 and NL22 has been removed, and a groove portion (a type of stepped groove) has been formed. Here, the formed stepped groove is indi-cated by reference number ST10.

FIG. 16 to FIG. 19 illustrate the process for forming the stepped groove ST10 by using the first and second photo-resist patterns PR1 and PR2, but this is an example and the process for forming the stepped groove ST10 may vary depending on the cases. The photoresist shrinking process may not be applied, and the first and second photoresist patterns PR1 and PR2 may be replaced with a mask material other than photoresist. In addition, the process for forming the stepped groove ST10 may be changed in various ways.

Figure 20:
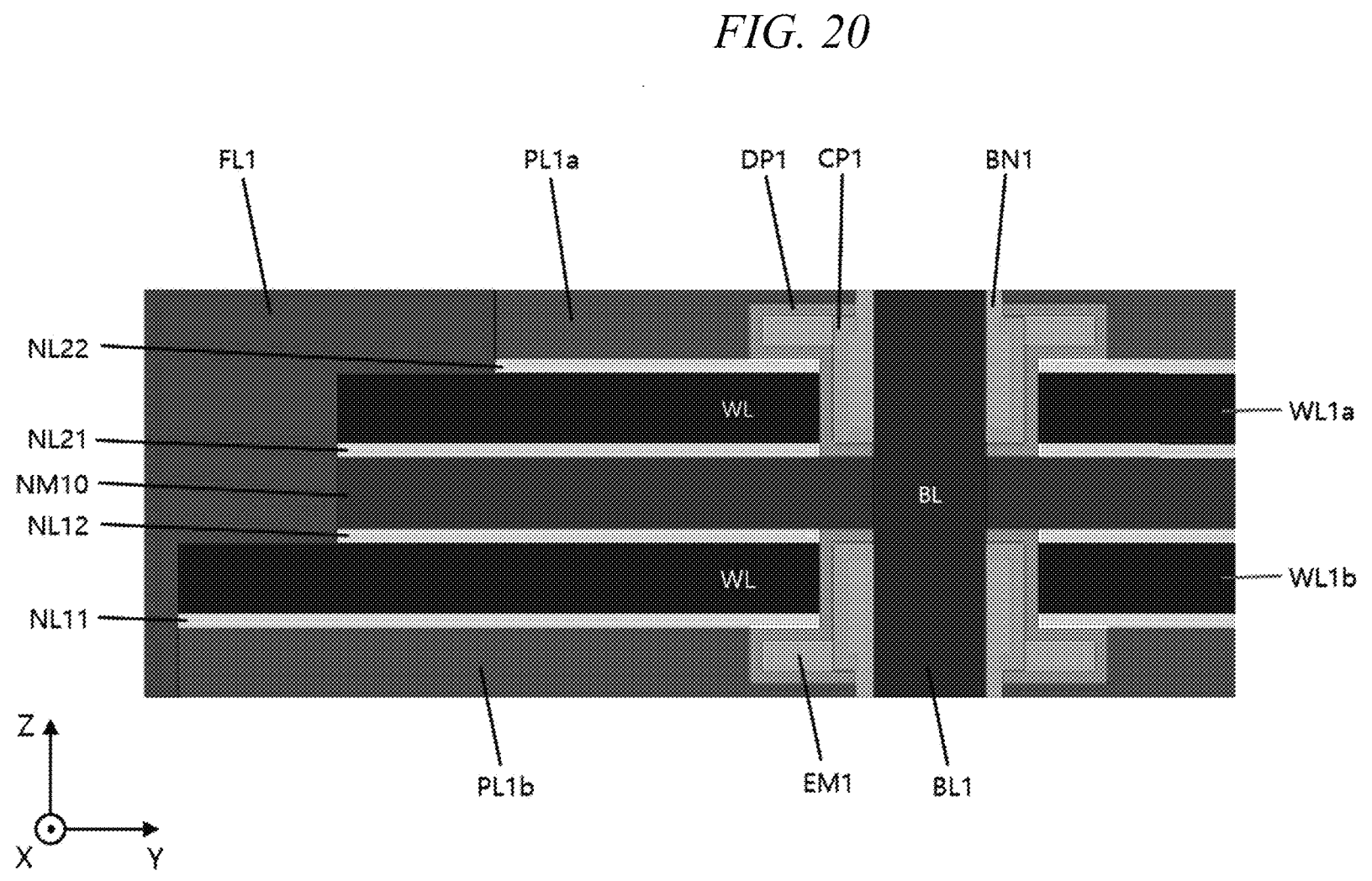

Referring to FIG. 20, an insulating filler FL1 may be formed to fill the stepped groove (ST10 in FIG. 19). The insulating filler FL1 may be a member to protect exposed portions of the word lines WL1a and WL1b in a subsequent process. The insulating filler FL1 may be formed to include at least one of various insulating materials. After forming the insulating filler FL1, the second photoresist pattern (PR2 in FIG. 19) may be removed. However, the timing of removal the second photoresist pattern (PR2 in FIG. 19) may vary.

Figure 21:
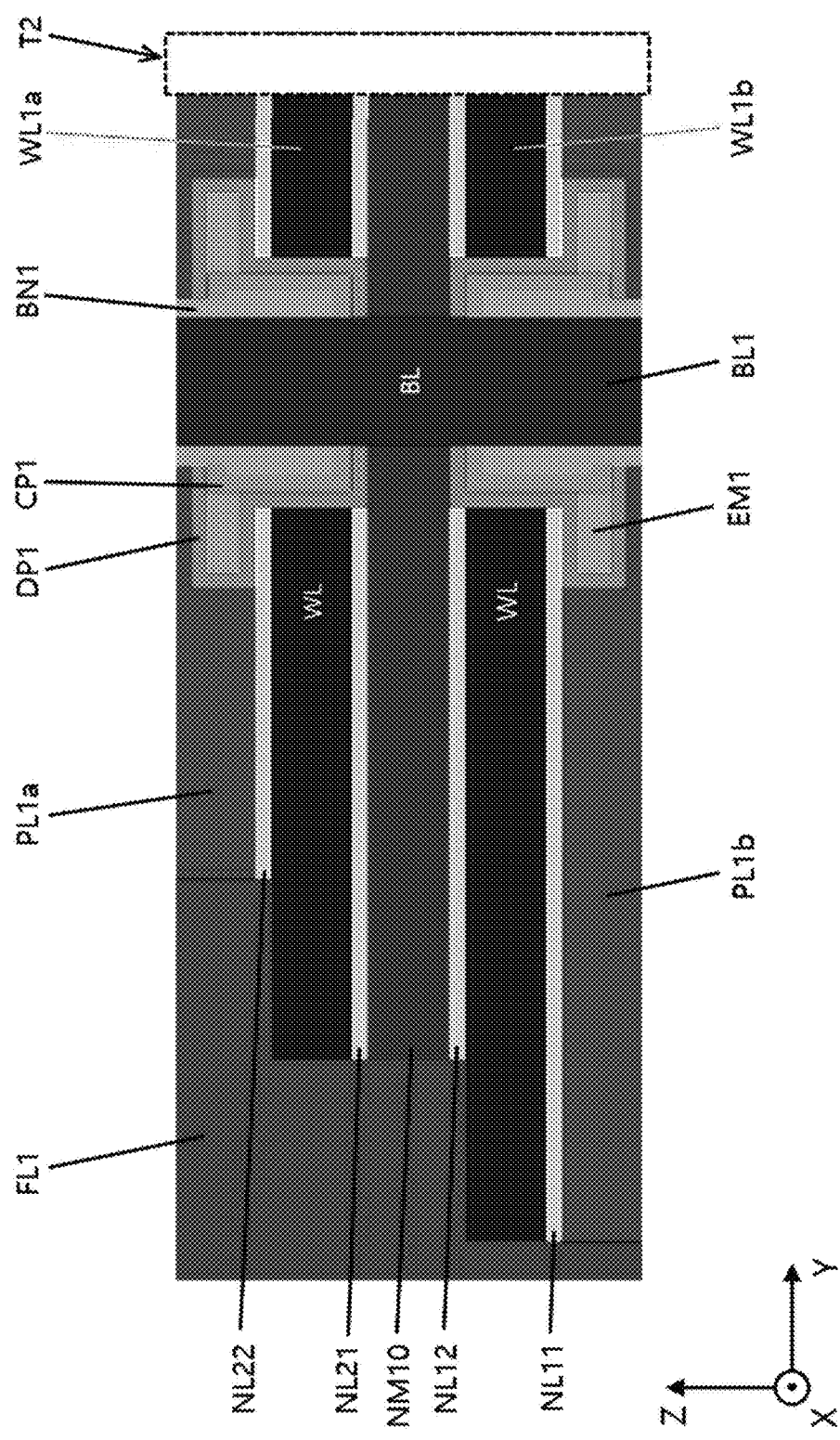

Referring to FIG. 21, a second trench T2 penetrating through the insulating material layer NM10 from the plate electrode PL1a may be formed on an opposite side of the stepped groove (ST10 in FIG. 19) with the vertical bit line BL1 interposed therebetween, that is, on an opposite side of the insulating pillar FL1. The second trench T2 may be formed to penetrate through a stacked structure consisting of the plurality of plate electrodes PL1a, PL1b, the plurality of word lines WL1a, WL1b, the insulating material layer NM10, the first and second lower insulating layers NL11, NL12, and the first and second upper insulating layers NL21 and NL22. The second trench T2 may be formed through a dry etching process.

Figure 22:
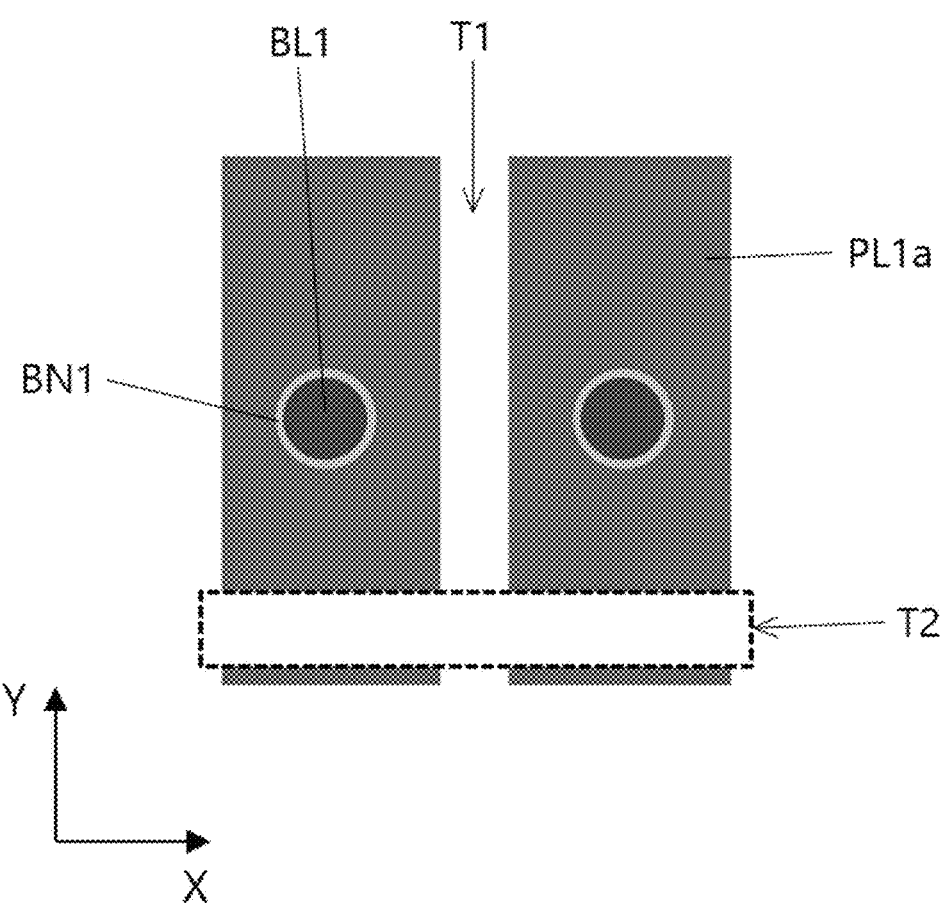

FIG. 22 is a plan view corresponding to a portion of the structure of FIG. 21. As shown in FIG. 22, the second trench T2 may be formed to extend in the X-axis direction to cross the plurality of first plate electrodes PL1a. For convenience, the insulating pillar FL1 of FIG. 21 is not shown in FIG. 22.

Figure 23:
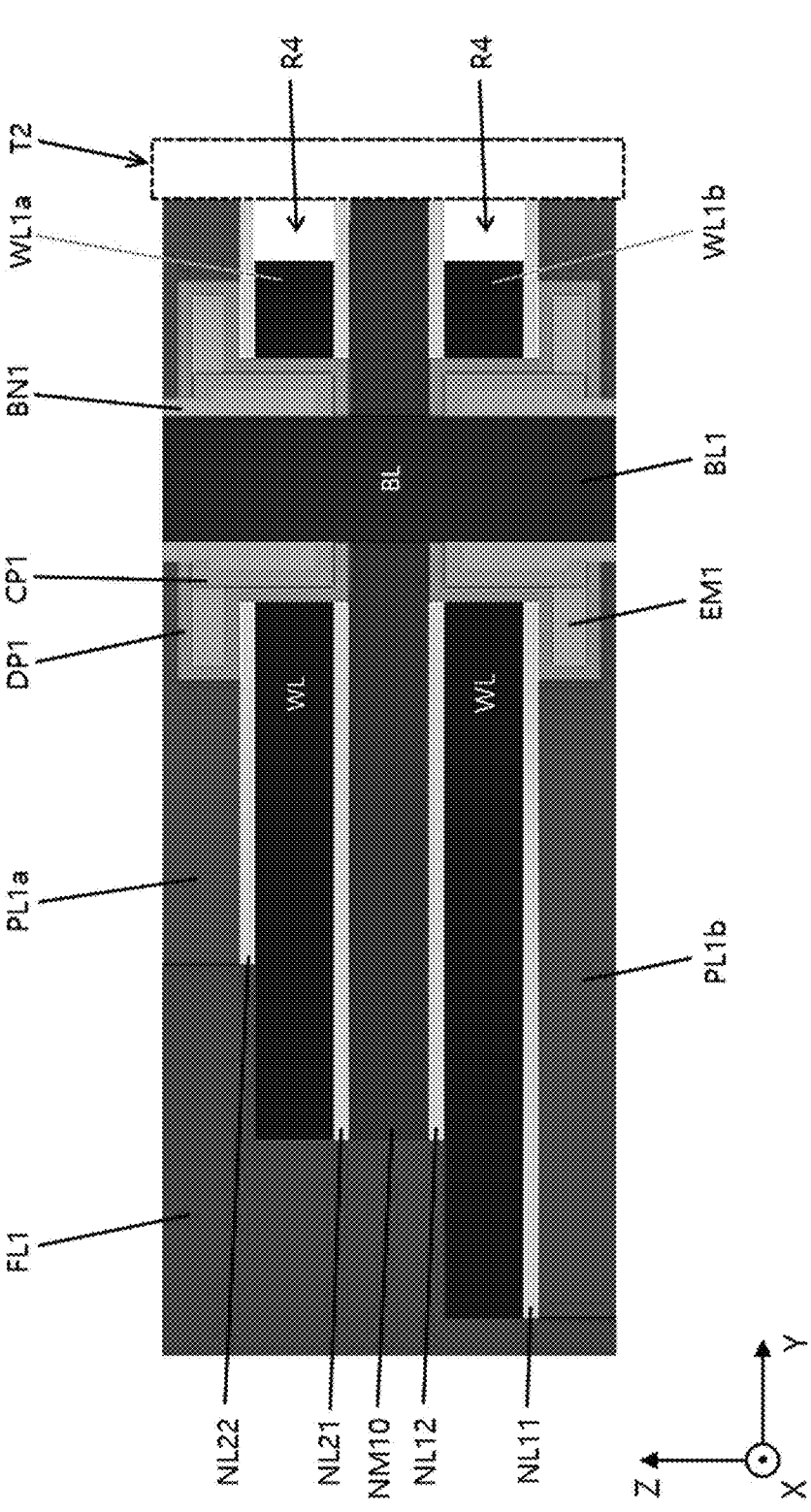

Referring to FIG. 23, a fourth recess (fourth recess portion) R4 may be formed by removing a portion of the word lines WL1a and WL1b exposed by the second trench T2. The fourth recess R4 may be formed by injecting an etching solution having selectivity through the second trench T2 and then, recessing the sidewall portions of the word lines WL1a and WL1b exposed by the second trench T2. The fourth recess R4 may be formed in plural numbers.

Figure 24:
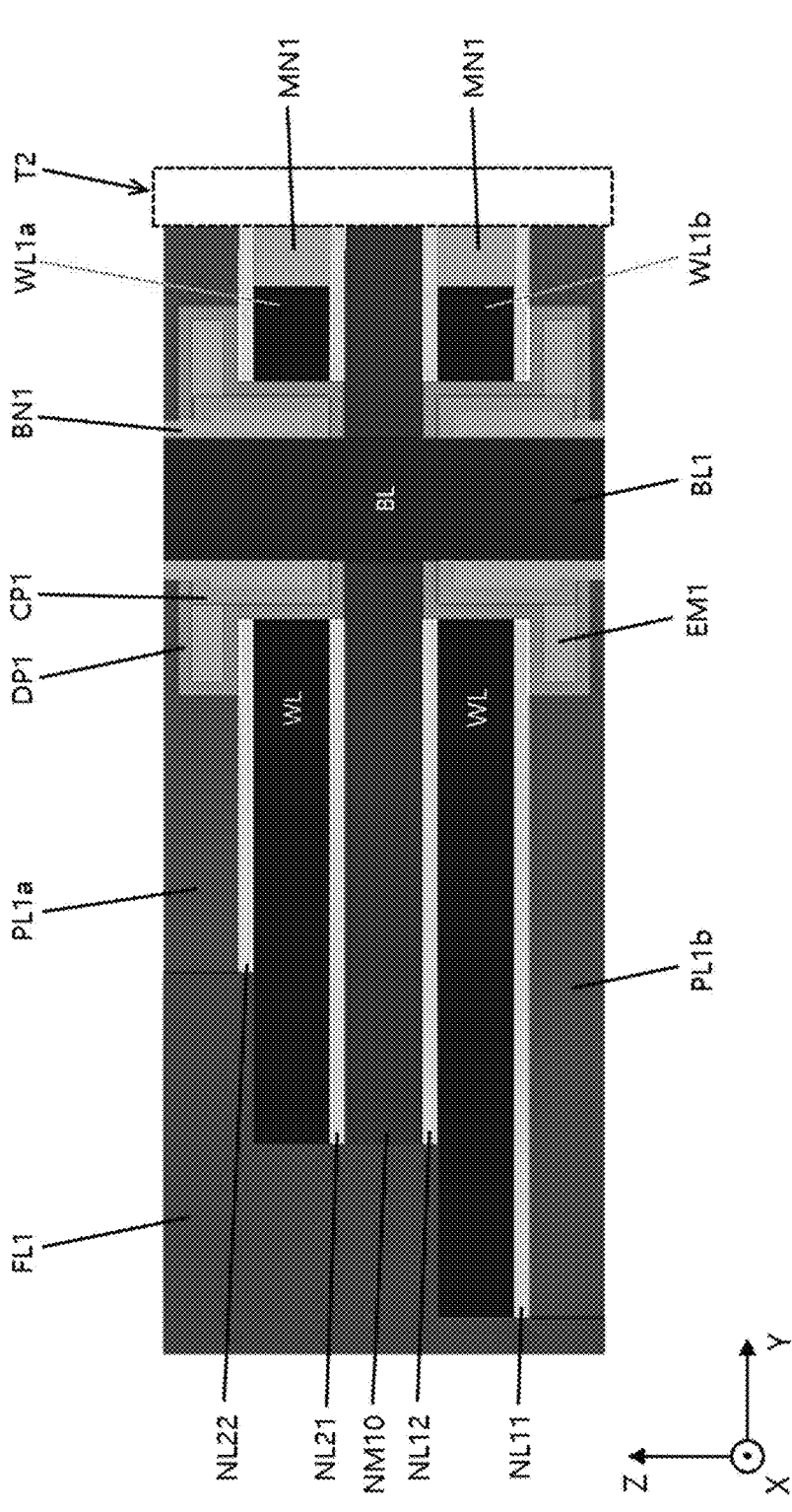

Referring to FIG. 24, a separation insulating layer MN1 filling the fourth recess R4 and separating the word lines WL1a, WL1b from the second trench T2 may be formed. An insulating material may be deposited to fill the fourth recess R4, and at this time, the insulating material may also be deposited in the second trench T2. The insulating material deposited in the second trench T2 may be removed through a dry etching process, and as a result, the space of the second trench T2 or a space substantially corresponding thereto may be secured (restored) again.

Figure 25:
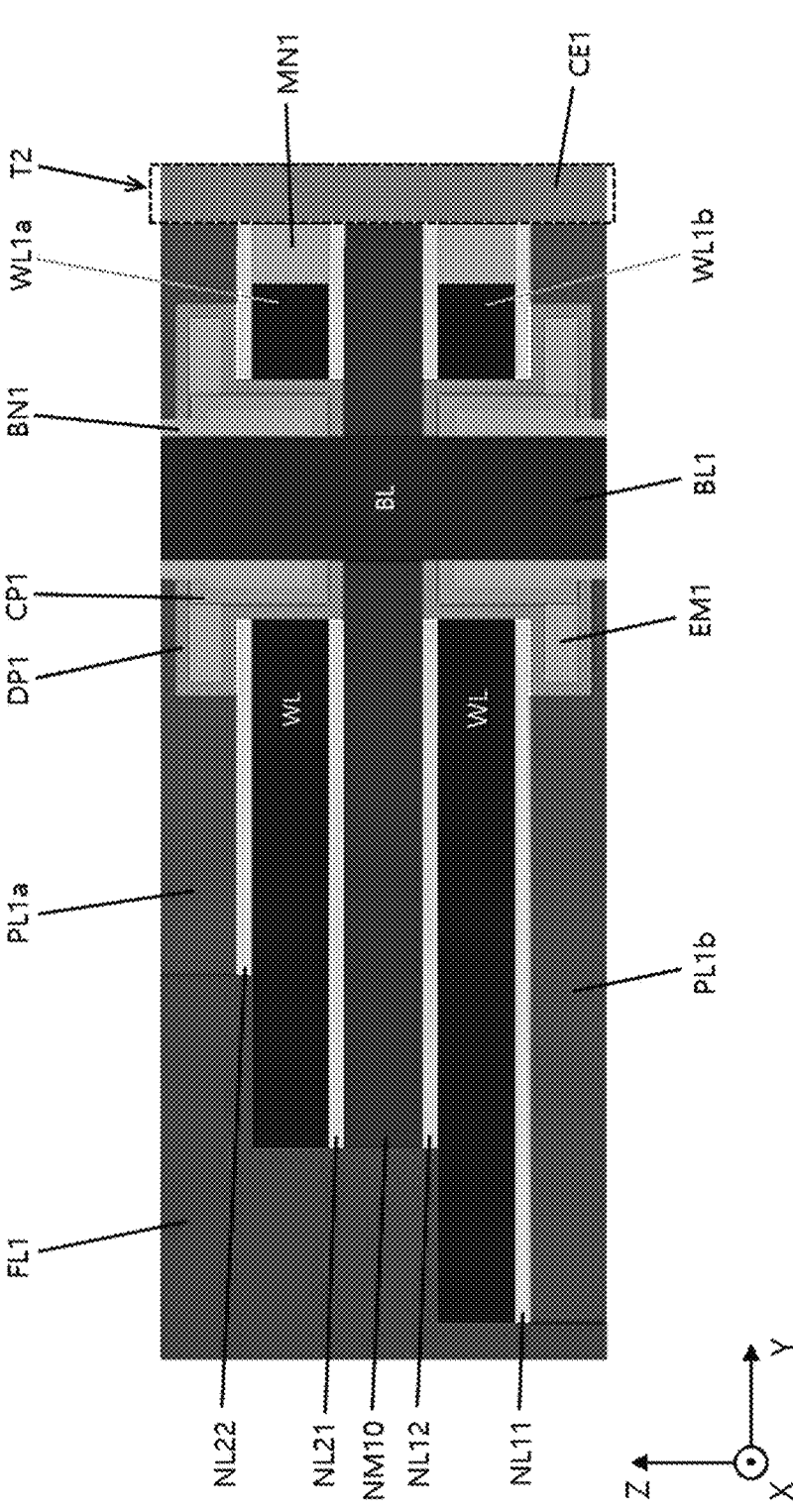

Referring to FIG. 25, a common electrode portion CE1 filling the second trench T2 and being connected to the plate electrodes PL1a and PL1b may be formed. The common electrode portion CE1 may be formed to interconnect a plurality of plate electrodes PL1a and PL1b spaced apart in the vertical direction. Furthermore, the common electrode portion CE1 may be formed to interconnect a plurality of plate electrodes in the X-axis direction. The common elec-trode portion CE1 may be formed to include one or more of various electrode materials used in semiconductor device processing. When observed from the above direction, the common electrode portion CE1 may have a type of line shape. Accordingly, the common electrode portion CE1 may be referred to as a common electrode line.

Figure 26:
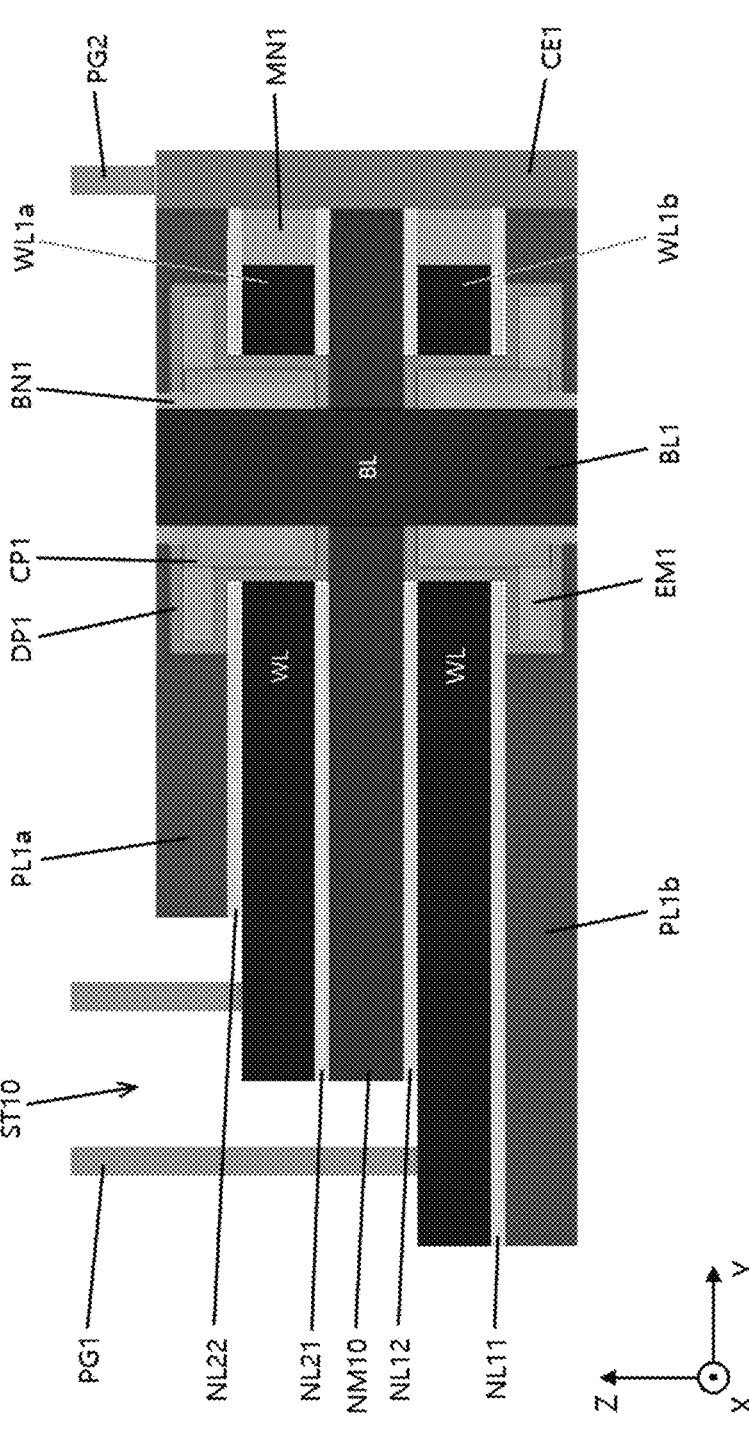

Referring to FIG. 26, a first contact plug PG1 connected to the word lines WL1a, WL1b exposed by the stepped groove ST10 and a second contact plug PG2 connected to the common electrode portion CE1 may be formed. A first contact plug PG1 connected to each of the plurality of word lines WL1a and WL1b may be formed. The first and second contact plugs PG1 and PG2 may be formed to include at least one conductive material selected from metal and metal compounds. The insulating filler (FL1 in FIG. 25) may be selectively removed, but may not be removed. In the latter case, at least a portion of the first contact plug PG1 may be formed to penetrate through the insulating pillar (FL1 in FIG. 25). For convenience, the insulating filler (FL1 in FIG. 25) is not shown in FIG. 26. If the insulating filler (FL1 in FIG. 25) is removed, another insulating layer may be formed, and then the first and second contact plugs PG1 and PG2 may be formed to penetrate the other insulating layer.

Figure 27:
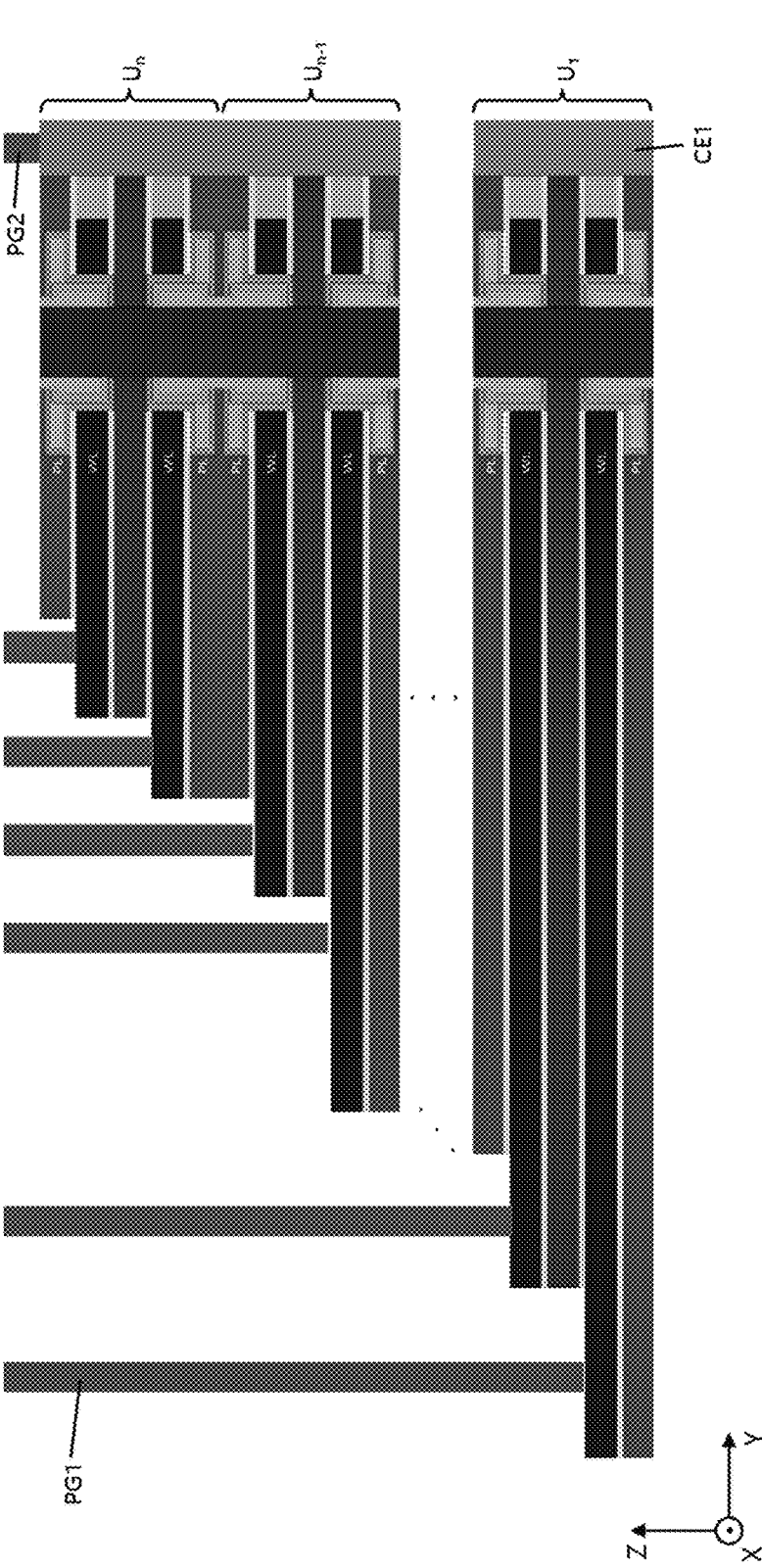
FIG. 27 is a cross-sectional view illustrating a structure which a vertical stack-type memory device manufactured according to an embodiment of the present invention may have.

FIG. 27 is a cross-sectional view illustrating a structure which a vertical stack-type memory device manufactured according to an embodiment of the present invention may have.

Referring to FIG. 27, a vertical stack-type memory device according to an embodiment of the present invention may include a structure in which a plurality of stacked device units $U_1$ to $U_n$ are stacked on a substrate (not shown). Each of the stacked device units $U_1$ to $U_n$ may include a structure corresponding to the structure described in FIG. 26 or similar to the structure described in FIG. 26. Since a memory device may be constructed by stacking a plurality of stacked device units $U_1$ to $U_n$ in the vertical direction, it may be advantageous to greatly improve integration and memory capacity.

Figure 28:
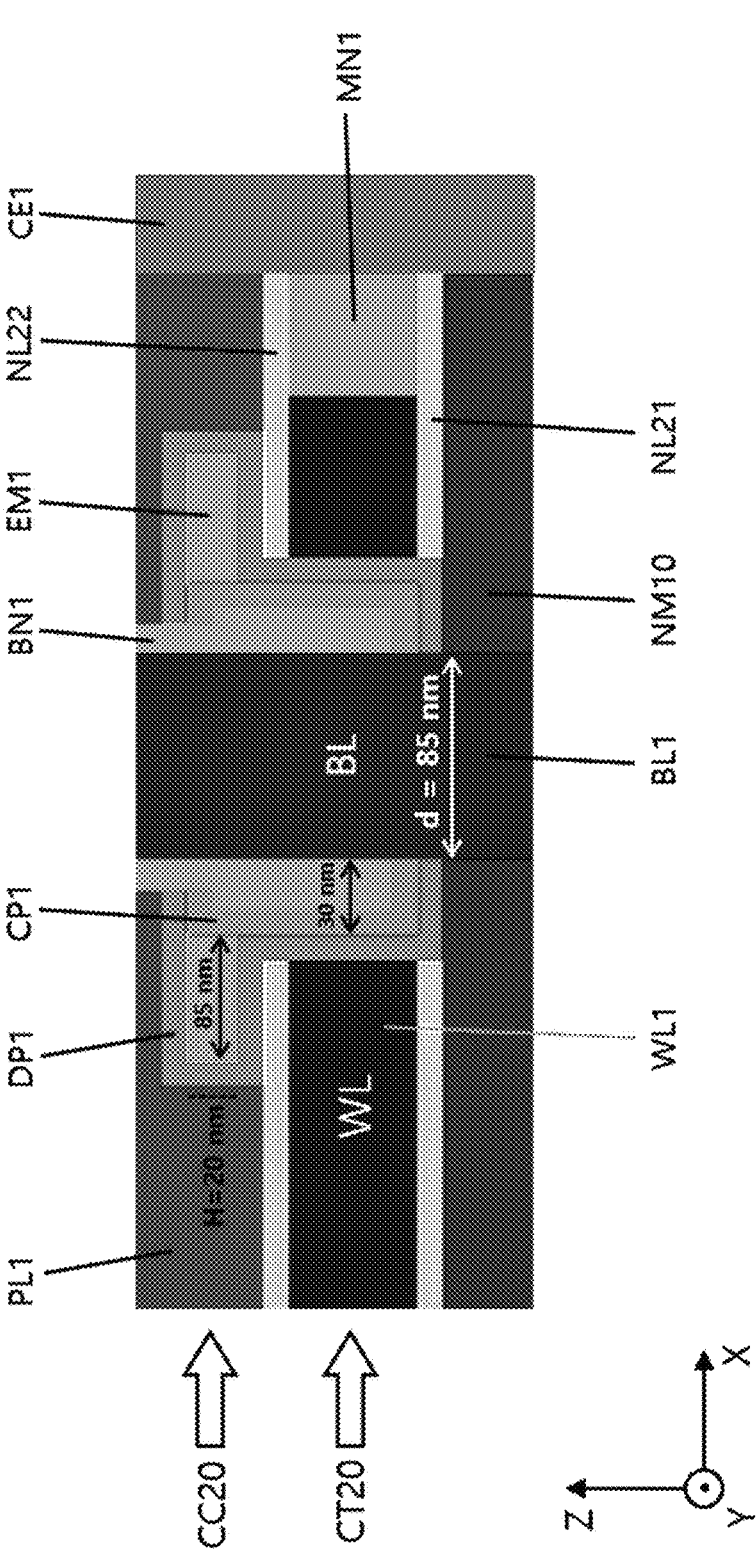
FIG. 28 is a cross-sectional view for explaining a vertical stack-type memory device according to an embodiment of the present invention.

FIG. 28 is a cross-sectional view for explaining a vertical stack-type memory device according to an embodiment of the present invention.

Referring to FIG. 28, a vertical stack-type memory device according to an embodiment of the present invention may have the structure described in FIGS. 15A and 26. The vertical stack-type memory device may include an upper memory cell (a first memory cell). The upper memory cell (a first memory cell) may include an a word line WL1 extending in a horizontal direction and having a vertical through-hole region, a vertical bit line BL1 arranged verti-cally to pass through the through-hole region, a channel layer CP1 disposed to surround the vertical bit line BL1 inside the through-hole region, with one end connected to the vertical bit line BL1 and extending upwardly more than the upper surface of the word line WL1, a body insulating layer BN1 disposed between the vertical bit line BL1 and a remaining portion except for the one end of the channel layer pattern CP1, an electrode member EM1 arranged to surround the outer peripheral surface of the channel layer pattern CP1 at a height higher than the word line WL1, a dielectric layer pattern DP1 disposed between the word line WL1 and the channel layer pattern CP1 and having a structure surrounding the electrode member EM1, and one end of which is in contact with the vertical bit line BL1 and the other end of which in contact with the other end of the channel layer pattern CP1, and a plate electrode PL1 in contact with the dielectric layer pattern DP1 above the word line WL1.

An insulating material layer NM10 may be disposed under the word line WL1, and a first upper insulating layer NL21 may be disposed between the word line WL1 and the insulating material layer NM10. A second upper insulating layer NL22 may be disposed between the word line WL1 and the plate electrode PL1. A separation insulating layer MN1 bonded to one end of the word line WL1 may be further provided. A common electrode portion CE1 connected to the plate electrode PL1 and having a vertical structure may be further provided. The isolation insulating layer MN1 may be disposed between the word line WL1 and the common electrode portion CE1.

In an area above the insulating material layer NM10, the word line WL1, the channel layer pattern CP1, a first portion of the dielectric layer pattern DP1 disposed between the word line WL1 and the channel layer pattern CP1, and at least a portion of the vertical bit line BL1 may configure the upper cell transistor CT20, and the electrode member EM1, the plate electrode PL1, and a second portion of the dielectric layer pattern DP1 disposed between the electrode member EM1 and the plate electrode PL1 may constitute the upper cell capacitor CC20. The upper cell transistor CT20 and the upper cell capacitor CC20 may be electrically connected to each other. The upper cell transistor CT20 and the upper cell capacitor CC20 may constitute the upper memory cell (first memory cell).

The electrode member EM1 may have a ring-shaped structure. The dielectric layer pattern DP1 may have a structure which surrounds the vertical bit line BL1 and may also have a structure defines a first recess region and a second recess region disposed above the first recess region therein. The second recess region may have a structure outwardly extending as compared with the first recess region with respect to the vertical bit line BL1. The electrode member EM1 may be disposed in the second recess region. In addition, the vertical stack-type memory device according to this embodiment may have the same structure and characteristics as described with reference to FIGS. 15A and 26, etc.

In order to achieve a cell capacitance of 4.5 fF, it is expected that in case of a horizontal structure where STO (Sr—Ti—O) may be applied, the equivalent oxide thickness (EOT) is 0.3 nm level, and in case of a horizontal structure where STO may not be applied, the minimum is 0.5 nm level. An expected capacitor area to satisfy the capacitance characteristic is converted to about 0.078 $\mu m^2$ for the vertical stack-type memory device according to the embodiment, and when the width of the transistor is calculated by using the capacitor area, it is 440 nm (length 50 nm) level. If calculating the mobility required for the channel based on the calculated width information, and when assuming ONcurrents of 0.25 μA and 1 μA, it was 0.21 $cm^2$/Vs and 0.82 $cm^2$/Vs, respectively. Although the dimensions of some components are shown in FIG. 28, this is merely an example, and the dimensions of each component may vary.

Figure 29:
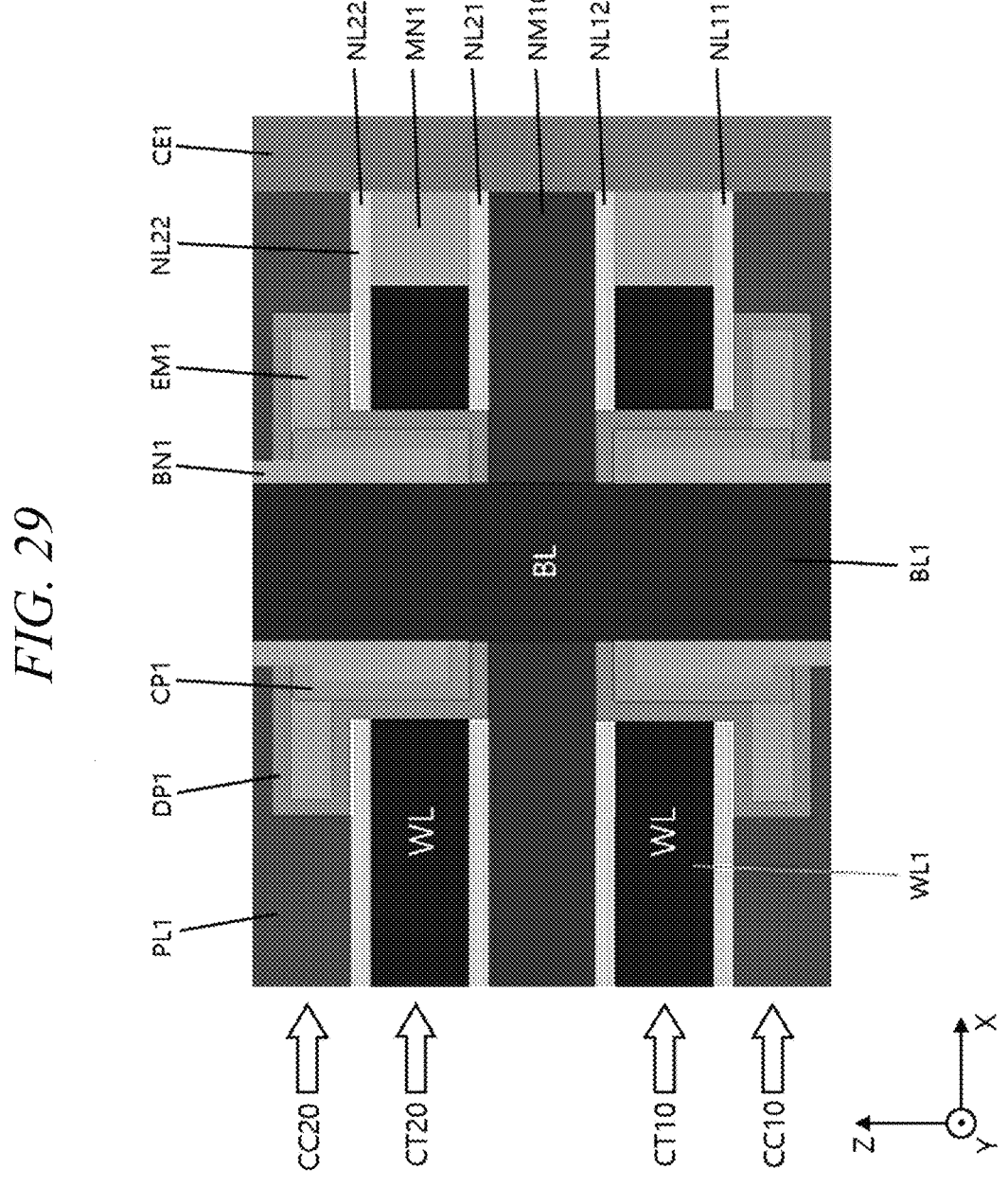
FIG. 29 is a cross-sectional view for explaining a vertical stack-type memory device according to an embodiment of the present invention.

FIG. 29 is a cross-sectional view for explaining a vertical stack-type memory device according to an embodiment of the present invention.

Referring to FIG. 29, the vertical stack-type memory device according to an embodiment of the present invention may further include a lower memory cell (second memory cell) disposed below the upper memory cell (first memory cell) in the memory device described in FIG. 28. The lower memory cell (second memory cell) may have a structure in which the upper memory cell (first memory cell) is upside down. The lower memory cell (second memory cell) may include a lower cell transistor CT10 having a structure in which the upper cell transistor CT20 is vertically upside down (inverted), and a lower cell capacitor CC10 having a structure in which the upper cell capacitor CC20 is vertically upside down (inverted). In an area under the insulating material layer NM10, the word line WL1, the channel layer pattern CP1, a first portion of the dielectric layer pattern DP1 disposed between the word line WL1 and the channel layer pattern CP1, and at least a portion of the vertical bit line BL1 may constitute the lower cell transistor CT10, and the electrode member EM1, the plate electrode PL1, and a second portion of the dielectric layer pattern DP1 disposed between the electrode member EM1, the plate electrode PL1 may constitute the lower cell capacitor CC10. The common electrode portion CE1 may be arranged to connect the plurality of plate electrodes PL1 to each other. The reference numeral NL11 denotes the first lower insulating layer, and NL12 denotes the second lower insulating layer. In addition, the vertical stack-type memory device according to this embodiment may have the same structure and characteristics as described with reference to FIGS. 15A and 26, etc.

According to the embodiments of the present invention described above, it is possible to implement a vertical stack-type memory device which may significantly improve integration degree and have excellent performance and operation characteristics. In particular, in the vertical stack-type memory device according to embodiments of the present invention, the electrode member and the channel layer pattern are independently formed in a three-dimensional stacked structure, and the electrode member and the channel layer pattern are formed in a predetermined form according to a given method, respectively. Therefore, the operating characteristics and performance of the capacitor including the electrode member, and the transistor including the channel layer pattern may be improved. The vertical stack-type memory device according to an embodiment of the present invention may be a vertical-type DRAM device or a three-dimensional DRAM device.

However, at least some of the device structures and the manufacturing methods according to embodiments of the present invention may be applied to the technological fields for implementing DRAM devices, and other memory devices (e.g., PRAM, RRAM, SRAM, flash memory, MRAM, FRAM, etc.) or a logic element with integrated logic circuit.

In this specification, the preferred embodiments of the present invention have been disclosed, and although specific terms have been used, they are only used in a general sense to easily explain the technological content of the present invention and to help understanding the present invention, and they are not used to limit the scope of the present invention. It is obvious to those having ordinary skill in the related art to which the present invention belong that other modifications based on the technological idea of the present invention may be implemented in addition to the embodiments disclosed herein. It will be understood to those having ordinary skill in the related art that in connection with the vertical stack-type memory devices and manufacturing methods thereof according to the embodiment described with reference to FIGS. 1A to 29, various substitutions, changes, and modifications may be made without departing from the technological spirit of the present invention. Therefore, the scope of the invention should not be determined by the described embodiments, but should be determined by the technological concepts described in the claims.

The embodiments of the present invention may be applied to semiconductor/electronic devices and manufacturing methods thereof. For example, the embodiments of the present invention may be applied to memory devices and methods of manufacturing thereof.

The invention claimed is:

1. A manufacturing method of a vertical stack-type memory device comprising:

forming an upper stack including a first upper insulating layer, a first upper sacrificial layer, a second upper insulating layer, a second upper sacrificial layer, and an upper buffer layer which are sequentially stacked on an insulating material layer;

forming a first vertical hole penetrating through the upper stack;

forming a first recess by removing portions of the first and second upper sacrificial layers and the first and second upper insulating layers exposed by the first vertical hole;

forming a second recess by further removing a portion of the second upper sacrificial layer exposed by the first recess;

forming a dielectric material layer on an inner surface of the first vertical hole including surfaces of the first and second recesses;

forming an electrode member filling the second recess on a region of the dielectric material layer formed in the second recess;

forming a channel material layer on the dielectric material layer and the electrode member exposed on the inner surface of the first vertical hole;

forming a dielectric layer pattern from the dielectric material layer, and forming a channel layer pattern from the channel material layer by removing portions of the dielectric material layer and the channel material layer which are disposed outside the first and second recesses;

forming a body insulating layer covering the channel layer pattern and the dielectric layer pattern and filling the first vertical hole;

forming a second vertical hole penetrating through the body insulating layer and exposing one end of the channel layer pattern;

forming a vertical bit line filling the second vertical hole;

forming a first trench disposed spaced apart from the vertical bit line and penetrating through the upper stack;

forming a third recess by removing the first upper sacrificial layer exposed by the first trench;

forming a word line filling the third recess;

exposing a portion of the dielectric layer pattern by removing the second upper sacrificial layer and the upper buffer layer; and forming a plate electrode in contact with the exposed portion of the dielectric layer pattern.

2. The manufacturing method of a vertical stack-type memory device of claim 1, wherein the forming the electrode member includes forming an electrode material layer filling the second recess on the dielectric material layer; and removing a remaining portion except for the portion disposed in the second recess in the electrode material layer by using a wet etching method.

3. The manufacturing method of a vertical stack-type memory device of claim 1, wherein a first region of the channel layer pattern is connected to the vertical bit line, and a second region of the channel layer pattern is connected to the electrode member.

4. The manufacturing method of a vertical stack-type memory device of claim 1, wherein the word line, the channel layer pattern, a first portion of the dielectric layer pattern disposed between the word line and the channel layer pattern, and at least a portion of the vertical bit line constitute an upper cell transistor, the electrode member, the plate electrode and a second portion of the dielectric layer pattern disposed between the electrode member and the plate electrode constitute an upper cell capacitor, and the upper cell transistor and the upper cell capacitor constitute an upper memory cell.

5. The manufacturing method of a vertical stack-type memory device of claim 4, wherein a lower memory cell having a structure in which the upper memory cell is upside down is formed under the insulating material layer, and the lower memory cell includes a lower cell transistor having a structure in which the upper cell transistor is upside down and a lower cell capacitor having a structure in which the upper cell capacitor is upside down.

6. The manufacturing method of a vertical stack-type memory device of claim 1, further comprising forming a stepped groove exposing a portion of the word line by removing a portion of the plate electrode and a portion of the second upper insulating layer;

forming an insulating filler that fills the stepped groove;

forming a second trench penetrating through the insulating material layer from the plate electrode on an opposite side of the stepped groove with the vertical bit line interposed therebetween;

forming a fourth recess by removing a portion of the word line exposed by the second trench;

forming an isolation insulating layer filling the fourth recess and separating the word line from the second trench; and forming a common electrode portion filling the second trench and being connected to the plate electrode.

7. The manufacturing method of a vertical stack-type memory device of claim 6, wherein the vertical stack-type memory device comprises a plurality of plate electrodes spaced apart in a vertical direction, and the common electrode portion is formed to interconnect the plurality of plate electrodes.

8. The manufacturing method of a vertical stack-type memory device of claim 6, further comprising forming a first contact plug connected to the word line exposed by the stepped groove and a second contact plug connected to the common electrode portion.

9. The manufacturing method of a vertical stack-type memory device of claim 1, wherein the first upper sacrificial layer includes a silicon nitride having a first composition, and the second upper sacrificial layer includes a silicon nitride having a second composition different from the first composition.

10. The manufacturing method of a vertical stack-type memory device of claim 1, wherein the insulating material layer includes a silicon oxide having a first density, and the first and second upper insulating layers include a silicon oxide having a second density less than the first density.

11. The manufacturing method of a vertical stack-type memory device of claim 1, wherein the upper buffer layer includes silicon.

12. A manufacturing method of a vertical stack-type memory device comprising:

forming a lower stack including a lower buffer layer, a first lower sacrificial layer, a first lower insulating layer, a second lower sacrificial layer, and a second lower insulating layer which are sequentially stacked;

forming an insulating material layer on the lower stack;

forming an upper stack including a first upper insulating layer, a first upper sacrificial layer, a second upper insulating layer, a second upper sacrificial layer, and an upper buffer layer which are sequentially stacked on the insulating material layer;

forming a first vertical hole penetrating through the upper stack, the insulating material layer, and the lower stack;

forming a plurality of first recesses by removing portions of the first and second upper sacrificial layers, the first and second upper insulating layers, the first and second lower sacrificial layers, and the first and second lower insulating layers exposed by the first vertical hole;

forming a plurality of second recesses by further removing portions of the first lower sacrificial layer and the second upper sacrificial layer exposed by the plurality of first recesses;

forming a dielectric material layer on an inner surface of the first vertical hole including surfaces of the plurality of first and second recesses;

forming a plurality of electrode members filling the plurality of second recesses on regions of the dielectric material layer formed in the plurality of second recesses;

forming a channel material layer on the dielectric material layer and the electrode member exposed on the inner surface of the first vertical hole;

forming a plurality of dielectric layer patterns from the dielectric material layer and forming a plurality of channel layer patterns from the channel material layer by removing portions of the dielectric material layer and the channel material layer which are disposed outside the first and second recesses;

forming a body insulating layer which covers the plurality of channel layer patterns and the plurality of dielectric layer patterns and fills the first vertical hole;

forming a second vertical hole penetrating through the body insulating layer and exposing one end of each of the plurality of channel layer patterns;

forming a vertical bit line filling the second vertical hole;

forming a first trench spaced apart from the vertical bit line and penetrating through the upper and lower stacks;

forming a plurality of third recesses by removing the first upper sacrificial layer and the second lower sacrificial layer exposed by the first trench;

forming a plurality of word lines filling the plurality of third recesses;

exposing a portion of the plurality of dielectric layer patterns by removing the second upper sacrificial layer, the first lower sacrificial layer, the upper buffer layer, and the lower buffer layer; and forming a plurality of plate electrodes in contact with exposed portions of the plurality of dielectric layer patterns.

13. The manufacturing method of a vertical stack-type memory device of claim 12, wherein the forming the plurality of electrode members includes forming an electrode material layer filling the plurality of second recesses on the dielectric material layer; and removing a remaining portion of the electrode material layer except for the portion disposed in the plurality of second recesses by using a wet etching method.

14. The manufacturing method of a vertical stack-type memory device of claim 12, wherein a first region of each of the plurality of channel layer patterns is connected to the vertical bit line, and a second region of each of the plurality of channel layer patterns is connected to the electrode member.

15. The manufacturing method of a vertical stack-type memory device of claim 12, further comprising forming a stepped groove exposing a portion of each of the plurality of word lines by removing a portion of a stacked structure composed of the plurality of plate electrodes, the plurality of word lines, the insulating material layer, the first and second lower insulating layers, and the first and second upper insulating layers;

forming an insulating filler which fills the stepped groove;

forming a second trench penetrating through the stacked structure on an opposite side of the stepped groove with the vertical bit line interposed therebetween;

forming a plurality of fourth recesses by removing a portion of the plurality of word lines exposed by the second trench;

forming a plurality of isolation insulating layers filling the plurality of fourth recesses and separating the plurality of word lines from the second trench; and forming a common electrode portion filling the second trench and interconnecting the plurality of plate electrodes.

16. The manufacturing method of a vertical stack-type memory device of claim 15, further comprising forming a plurality of first contact plugs connected to the plurality of word lines exposed by the stepped groove, and a second contact plug connected to the common electrode portion.

17. A vertical stack-type memory device comprising an upper memory cell, the upper memory cell comprising:

a word line extending in a horizontal direction and having a vertical through-hole region;

a vertical bit line arranged vertically to pass through the through-hole region;

a channel layer pattern arranged to surround the vertical bit line inside the through-hole region, one end of which is connected to the vertical bit line and extending upward beyond an upper surface of the word line;

a body insulating layer disposed between the vertical bit line and a remaining portion except for the one end of the channel layer pattern;

an electrode member arranged to surround an outer peripheral surface of the channel layer pattern at a height higher than the word line;

a dielectric layer pattern disposed between the word line and the channel layer pattern and having a structure surrounding the electrode member, one end of which is in contact with the vertical bit line and the other end of which is in contact with the other end of the channel layer pattern; and a plate electrode in contact with the dielectric layer pattern above the word line.

18. The vertical stack-type memory device of claim 17, wherein the electrode member has a ring-shaped structure.

19. The vertical stack-type memory device of claim 17, wherein the dielectric layer pattern has a structure surrounding the vertical bit line and has a structure defining a first recess region therein and a second recess region disposed above the first recess region, the second recess region has a structure extending more outwardly than the first recess region with respect to the vertical bit line, and the electrode member is disposed in the second recess region.

20. The vertical stack-type memory device of claim 17, wherein the vertical stack-type memory device further includes a lower memory cell disposed below the upper memory cell, and the lower memory cell has a structure in which the upper memory cell is upside down.

* * * * *